(12) United States Patent
Akimoto et al.

(10) Patent No.: US 9,257,416 B2
(45) Date of Patent: Feb. 9, 2016

(54) SEMICONDUCTOR LIGHT EMITTING DEVICE AND METHOD FOR MANUFACTURING SAME

(71) Applicant: Kabushiki Kaisha Toshiba, Minato-ku (JP)

(72) Inventors: Yosuke Akimoto, Kanagawa-ken (JP); Akihiro Kojima, Kanagawa-ken (JP); Miyoko Shimada, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/202,890

(22) Filed: Mar. 10, 2014

(65) Prior Publication Data

US 2014/0191258 A1    Jul. 10, 2014

Related U.S. Application Data

(63) Continuation of application No. PCT/JP2012/001803, filed on Mar. 14, 2012.

(30) Foreign Application Priority Data

Sep. 16, 2011    (JP) .................. 2011-203855

(51) Int. Cl.
*H01L 33/00* (2010.01)
*H01L 25/075* (2006.01)
(Continued)

(52) U.S. Cl.
CPC ............ *H01L 25/0753* (2013.01); *H01L 24/19* (2013.01); *H01L 25/50* (2013.01);
(Continued)

(58) Field of Classification Search
CPC ....... H01L 33/50; H01L 33/56; H01L 33/502; H01L 33/504; H01L 33/507
See application file for complete search history.

(56) References Cited

U.S. PATENT DOCUMENTS

| 6,613,455 B1 * | 9/2003 | Matsumoto | .......... | H05B 33/145 |
| | | | | 252/301.36 |
| 7,202,600 B2 * | 4/2007 | Zovko | ...................... | H01J 1/70 |
| | | | | 313/504 |

(Continued)

FOREIGN PATENT DOCUMENTS

| EP | 2 197 051 A2 | 6/2010 |
| EP | 2197051 A2 * | 6/2010 |

(Continued)

OTHER PUBLICATIONS

Office Action issued Jul. 11, 2014 in Japanese Patent Application No. 2011-203855 (with English language translation).

(Continued)

*Primary Examiner* — Nicholas Tobergte
(74) *Attorney, Agent, or Firm* — Oblon, McClelland, Maier & Neustadt, L.L.P.

(57) ABSTRACT

According to one embodiment, a semiconductor light emitting device includes not less than three chips. Each of the chips includes a semiconductor layer having a first face, a second face formed on a side opposite to the first face, and a light emitting layer, a p-side electrode, and an n-side electrode. The chips include a central chip centrally positioned in a plan view, and at least two peripheral chips arranged symmetrically to each other sandwiching the central chip in the plan view. A thickness of the fluorescent body layer on the first face is same among the peripheral chips, and the fluorescent body layer on the first face of the central chip and the fluorescent body layers on the first faces of the peripheral chips have thicknesses different from each other.

9 Claims, 15 Drawing Sheets

(51) Int. Cl.
*H01L 25/00* (2006.01)
*H01L 23/00* (2006.01)
*H01L 33/50* (2010.01)
*H01L 33/56* (2010.01)
*H05B 33/08* (2006.01)

(52) U.S. Cl.
CPC ............. *H01L 33/50* (2013.01); *H01L 33/505* (2013.01); *H01L 33/508* (2013.01); *H01L 33/0095* (2013.01); *H01L 33/502* (2013.01); *H01L 33/504* (2013.01); *H01L 33/507* (2013.01); *H01L 33/56* (2013.01); *H01L 2924/0002* (2013.01); *H01L 2924/12041* (2013.01); *H01L 2924/12042* (2013.01); *H01L 2924/181* (2013.01); *H01L 2933/0041* (2013.01); *H05B 33/0803* (2013.01)

(56) References Cited

U.S. PATENT DOCUMENTS

| | | | |
|---|---|---|---|
| 8,110,421 B2 | 2/2012 | Sugizaki et al. | |
| 8,148,183 B2 | 4/2012 | Hamasaki et al. | |
| 8,278,676 B2 | 10/2012 | Kojima et al. | |
| 8,288,843 B2 | 10/2012 | Kojima et al. | |
| 8,319,246 B2 | 11/2012 | Sugizaki et al. | |
| 8,350,285 B2 | 1/2013 | Sugizaki et al. | |
| 8,367,523 B2 | 2/2013 | Sugizaki et al. | |
| 8,368,089 B2 | 2/2013 | Kojima et al. | |
| 8,373,192 B2 | 2/2013 | Sugizaki et al. | |
| 8,377,726 B2 | 2/2013 | Kojima et al. | |
| 8,378,377 B2 | 2/2013 | Sugizaki et al. | |
| 8,399,275 B2 | 3/2013 | Akimoto et al. | |
| 8,436,378 B2 | 5/2013 | Kojima et al. | |
| 8,445,916 B2 | 5/2013 | Kojima et al. | |
| 8,502,260 B2 | 8/2013 | Sugizaki et al. | |
| 8,581,291 B2 | 11/2013 | Shimokawa et al. | |
| 2007/0262338 A1 | 11/2007 | Higashi et al. | |
| 2008/0191620 A1* | 8/2008 | Moriyama | H01L 33/56 313/506 |
| 2009/0212305 A1* | 8/2009 | Harada | 257/88 |
| 2009/0261358 A1 | 10/2009 | Chitnis et al. | |
| 2010/0148198 A1 | 6/2010 | Sugizaki et al. | |
| 2010/0157583 A1 | 6/2010 | Nakajima | |
| 2011/0204396 A1 | 8/2011 | Akimoto et al. | |
| 2011/0220931 A1 | 9/2011 | Kojima et al. | |
| 2011/0284910 A1 | 11/2011 | Iduka et al. | |
| 2011/0291148 A1 | 12/2011 | Sugizaki et al. | |
| 2011/0297965 A1 | 12/2011 | Akimoto et al. | |
| 2011/0297980 A1 | 12/2011 | Sugizaki et al. | |
| 2011/0297995 A1 | 12/2011 | Akimoto et al. | |
| 2011/0297997 A1 | 12/2011 | Izuka et al. | |
| 2011/0297998 A1 | 12/2011 | Akimoto et al. | |
| 2011/0298001 A1 | 12/2011 | Akimoto et al. | |
| 2011/0300644 A1* | 12/2011 | Akimoto | H01L 33/508 438/7 |
| 2011/0300651 A1 | 12/2011 | Kojima et al. | |
| 2012/0097972 A1 | 4/2012 | Sugizaki et al. | |
| 2013/0248915 A1* | 9/2013 | Shimada | H01L 33/007 257/99 |
| 2013/0320383 A1 | 12/2013 | Izuka et al. | |

FOREIGN PATENT DOCUMENTS

| | | |
|---|---|---|
| JP | 2000-244012 A | 9/2000 |
| JP | 2002-118293 A | 4/2002 |
| JP | 2003-046134 A | 2/2003 |
| JP | 2009-206246 A | 9/2009 |
| JP | 2010-109170 A | 5/2010 |
| JP | 2011-96739 A | 5/2011 |
| JP | 2011-155315 A | 8/2011 |
| TW | 201031033 A1 | 8/2010 |
| TW | 201130167 A1 | 9/2011 |

OTHER PUBLICATIONS

Office Action issued on Aug. 6, 2015 in Japanese Patent Application No. 2014-183598 with English translation.
Combined Taiwanese Office Action and Search Report issued on Dec. 26, 2014 in Patent Application No. 101109503 with English translation.
Office Action issued Feb. 19, 2015 in Japanese Patent Application No. 2011-203855 (with English language translation).
International Search Report issued on Jan. 8, 2013 for PCT/JP2012/001803 filed on Mar. 14, 2012.
International Written Opinion mailed on Jan. 8, 2013 for PCT/JP2012/001803 filed on Mar. 14, 2012.

\* cited by examiner

SEMICONDUCTOR LIGHT EMITTING DEVICE AND METHOD FOR MANUFACTURING SAME

CROSS-REFERENCE TO RELATED APPLICATION

This is a continuation application of International Application PCT/JP2012/001803, filed on Mar. 14, 2012; the entire contents of which are incorporated herein by reference. This application also claims priority to Japanese Application No. 2011-203855, filed on Sep. 16, 2011. The entire contents of each are incorporated herein by reference.

FIELD

Embodiments of the invention relates to a semiconductor light emitting device, and a method for manufacturing same.

BACKGROUND

The reduction of chromaticity variation in the development of a white light emitting diode (LED) is one of major problems. In particular, in a wafer-level packaging technique which carries out formation of a interconnect layer, protection resin, and a luminescent layer collectively for a plurality of chips within a wafer without performing a chip selection process, emission wavelength variation among the chips within the wafer affects the chromaticity variation considerably.

DETAILED DESCRIPTION

Figure 1:
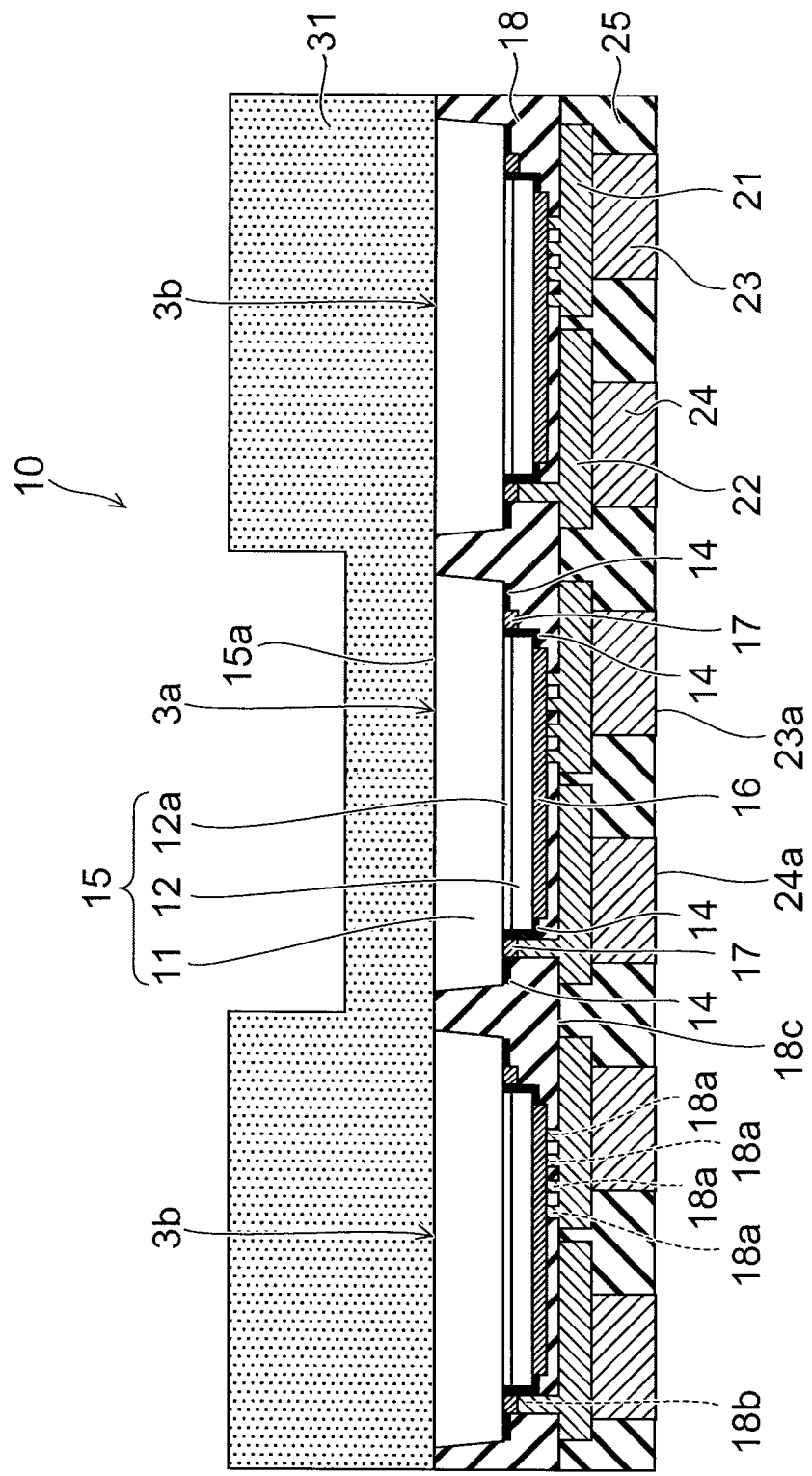
FIG. 1 is a schematic cross-sectional view of a semiconductor light emitting device 10 of a first embodiment.

According to one embodiment, a semiconductor light emitting device includes: not less than three chips, each of the chips including a semiconductor layer having a first face, a second face formed on a side opposite to the first face, and a light emitting layer, a p-side electrode provided on the second face in a region having the light emitting layer, and an n-side electrode provided on the second face in a region without having the light emitting layer; and fluorescent body layers of a same kind provided on the first faces of the chips. The chips include: a central chip centrally positioned in a plan view, and at least two peripheral chips arranged symmetrically to each other sandwiching the central chip in the plan view. A thickness of the fluorescent body layer on the first face is same among the peripheral chips, and the fluorescent body layer on the first face of the central chip and the fluorescent body layers on the first faces of the peripheral chips have thicknesses different from each other.

Embodiments of the invention will now be described with reference to the drawings. In each of the drawings, like components are marked with like reference numerals.

First Embodiment

FIG. 1 is a schematic cross-sectional view of a semiconductor light emitting device 10 of a first embodiment.

Figure 2A:
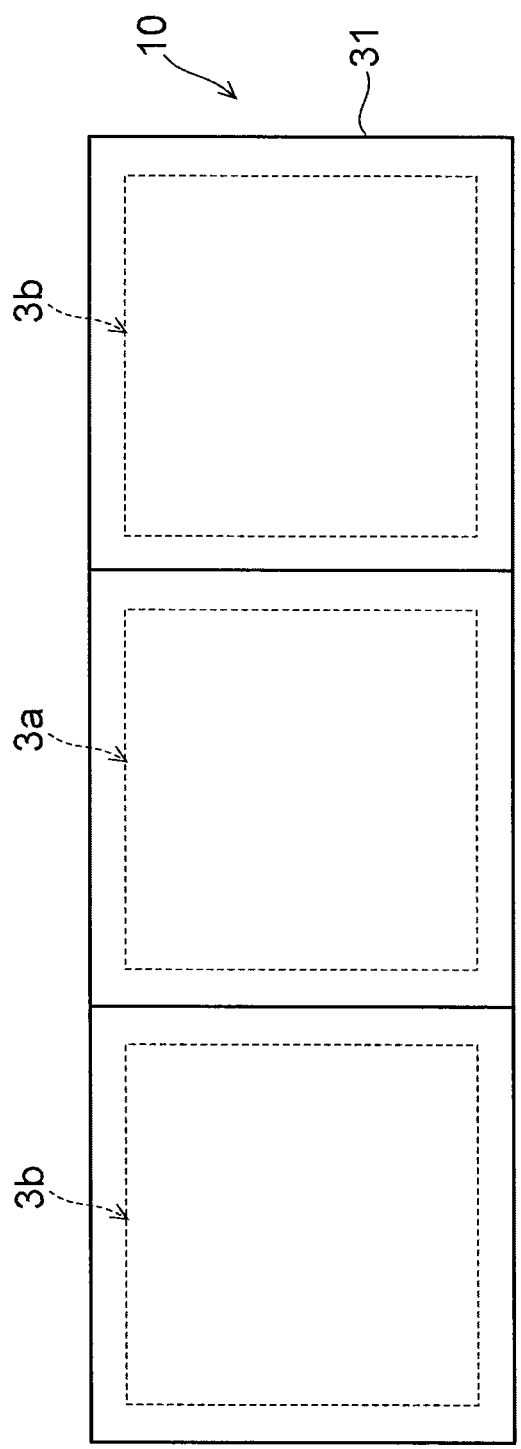
FIG. 2A is a schematic plan view of the semiconductor light emitting device of a first embodiment.
Figure 2B:
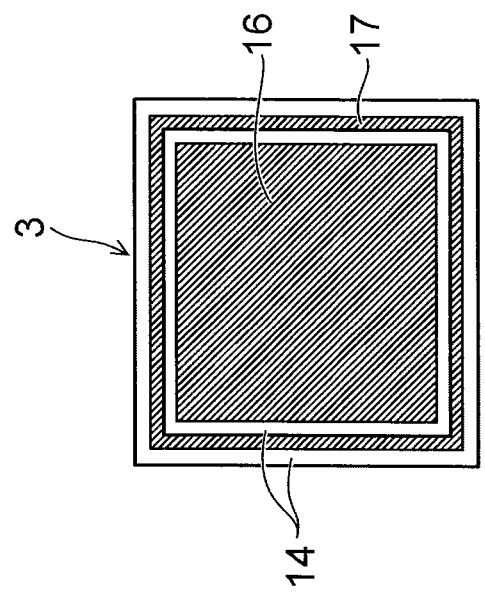
FIG. 2B is a schematic plan view of one chip.

FIG. 2A is a schematic plan view of the semiconductor light emitting device 10, and FIG. 2B is a schematic plan view of one chip.

The semiconductor light emitting device 10 is a multi-tip device including a plurality of chips 3a and 3b in a package structure body which is formed at a wafer level to be described below. The plurality of chips 3a and 3b are separated from one another. Each of the chips 3a and 3b has a semiconductor layer 15, a p-side electrode 16, and an n-side electrode 17.

The plurality of chips are denoted by different numerals 3a and 3b depending on a positional difference in the plan view shown in FIG. 2A. However, the chip 3a and the chip 3b have the same structure, and are sometimes denoted simply by a numeral 3 representatively without discrimination between the chips 3a and 3b.

The semiconductor layer 15 has a first face (upper face in FIG. 1) 15a and a second face formed on the side opposite thereto. The electrodes and interconnects are provided on the second face side. Light is emitted to the outside mainly from the first face 15a on the side opposite to the second face.

Furthermore, the semiconductor layer 15 has a first semiconductor layer 11 and a second semiconductor layer 12. The first semiconductor layer 11 and the second semiconductor layer 12 are made of material containing, for example, gallium nitride. The first semiconductor layer 11 includes, for example, a foundation buffer layer, an n-type layer, and the like, and the n-type layer functions as a lateral current pathway. The second semiconductor layer 12 includes a p-type layer and a light emitting layer (active layer) 12a.

The second face side of the semiconductor layer 15 is processed into a convex-concave shape. The convex part formed on the second face side includes the light emitting layer 12a. On the surface of the second semiconductor layer 12 being the surface of the convex part thereof, a p-side electrode 16 is provided. That is, the p-side electrode 16 is provided on a region having the light emitting layer 12a.

On the periphery of the convex part on the second face side of the semiconductor layer 15, a region which does not have the second semiconductor layer 12 including the light emitting layer 12a is provided, and, on the face of the first semiconductor layer 11 in the region, an n-side electrode 17 is provided. That is, the n-side electrode 17 is provided on the region without including the light emitting layer 12a.

In the plan view of the second face shown in FIG. 2B, the n-side electrode 17 surrounds the periphery of the p-side electrode 16 continuously. The plan view layout of the p-side electrode 16 and the n-side electrode 17 is not limited to the layout shown in FIG. 2B and another layout can be used.

On the second face side, the area of the second semiconductor layer including the light emitting layer 12a is larger than the area of the first semiconductor layer 11 which does not include the light emitting layer 12a. Furthermore, the area of the p-side electrode 16 is larger than the area of the n-side electrode 17. Accordingly, it is possible to obtain a large light emitting region.

On a side face of the second semiconductor layer 12 including the light emitting layer 12a, an insulating film 14 is provided. Moreover, the insulating film 14 is also provided on the second face on which the p-side electrode 16 and the n-side electrode 17 are not provided. The insulating film 14 is an inorganic insulating film such as, for example, a silicon oxide film and a silicon nitride film.

The second face side, on which the insulating film 14, the p-side electrode 16, and the n-side electrode 17 are provided, is covered by a first insulating layer (hereinafter, simply referred to as insulating layer) 18. The first face 15a is not covered by the insulating layer 18.

Furthermore, the insulating layer 18 fills a space between the chips 3a and 3b separated from each other, and covers sides of the chips 3a and 3b. A side of the semiconductor layer 15 continuing from the first face 15a is covered by the insulating layer 18. The insulating layer 18 covering each side face of the chips 3a and 3b constitutes a side face of the semiconductor light emitting device 10 together with a resin layer 25 covering a side of a interconnect part which will be described below.

The insulating layer 18 is a resin such as polyimide or the like having a good patterning properties for a fine opening, for example. Alternatively, an inorganic material such as silicon oxide or silicon nitride may be used for the insulating layer 18.

In the insulating layer 18, a first via 18a reaching the p-side electrode 16 and a second via 18b reaching the n-side electrode 17 are formed. Moreover, the insulating layer 18 has a interconnect face 18c on the side opposite to the first face 15a.

On the interconnect face 18c, a p-side interconnect layer 21 and an n-side interconnect layer 22 are provided apart from each other. For each one of the chips 3a and 3b, one p-side interconnect layer 21 and one n-side interconnect layer 22 are provided.

The p-side interconnect layer 21 is also provided within the first via 18a. The p-side interconnect layer 21 is electrically connected to the p-side electrode 16 through the plurality of first vias 18a.

The n-side interconnect layer 22 is also provided within the second via 18b. The n-side interconnect layer 22 is electrically connected to the n-side electrode 17 through one, for example, second via 18b.

On the face of the p-side interconnect layer 21 on the side opposite to the chips 3a and 3b, a p-side metal pillar 23 is provided. The p-side metal pillar 23 has a thickness larger than the thickness of the p-side interconnect layer 21. The p-side interconnect layer 21 and the p-side metal pillar 23 constitute a p-side interconnect part in the embodiment.

On the face of the n-side interconnect layer 22 on the side opposite to the chips 3a and 3b, an n-side metal pillar 24 is provided. The n-side metal pillar 24 has a thickness larger than the thickness of the n-side interconnect layer 22. The n-side interconnect layer 22 and the n-side metal pillar 24 constitute an n-side interconnect part in the embodiment.

Furthermore, on the interconnect face 18c of the insulating layer 18, a resin layer 25 is provided as a second insulating layer. The resin layer 25 covers the periphery of the p-side interconnect part and the periphery of the n-side interconnect part.

The face of the p-side interconnect layer 21 except a connection face with the p-side metal pillar 23 and the face of the n-side interconnect layer 22 except a connection face with the n-side metal pillar 24 are covered by the resin layer 25. Furthermore, the resin layer 25 is provided between the p-side metal pillar 23 and the n-side metal pillar 24, and covers a side face of the p-side metal pillar 23 and a side face of the n-side metal pillar 24. The resin layer 25 fills a space between the p-side metal pillar 23 and the n-side metal pillar 24.

The face of the p-side metal pillar 23 on the side opposite to the p-side interconnect layer 21 is exposed without being covered by the resin layer 25, and functions as a p-side external terminal 23a which is to be bonded to a mounting substrate. The face of the n-side metal pillar 24 on the side opposite to the n-side interconnect layer 22 is exposed without being covered by the resin layer 25, and functions as an n-side external terminal 24a which is to be bonded to the mounting substrate.

The respective thicknesses of the p-side interconnect part, the n-side interconnect part, and the resin layer 25 are larger than each of the thickness of the chips 3a and 3b. The aspect ratio (ration of a thickness to a planar size) of the p-side metal pillar 23 and the n-side metal pillar 24 is not limited to a value not smaller than one and the ratio may be smaller than one.

The p-side metal pillar 23, the n-side metal pillar 24, and the resin layer 25 which reinforces the metal pillars function as a support body for the chips 3a and 3b. Accordingly, even when a substrate used for forming the semiconductor layer 15 is removed as will be described below, the support body including the p-side metal pillar 23, the n-side metal pillar 24, and the resin layer 25 supports the chips 3a and 3b stably, and can increase the mechanical strength of the semiconductor light emitting device 10.

Furthermore, in a state in which the semiconductor light emitting device 10 is mounted on the mounting substrate, it is possible to reduce a stress applied to the semiconductor layer 15, by causing the p-side metal pillar 23 and the n-side metal pillar 24 to absorb the stress.

As the material for the p-side interconnect layer 21, the n-side interconnect layer 22, the p-side metal pillar 23, and the n-side metal pillar 24, copper, gold, nickel, silver, or the like can be used. When copper is used among these materials, it is possible to obtain a good thermal conductivity, a high migration resistance and a distinguished adhesion to insulating material.

As the resin layer 25, it is preferable to use a resin having a coefficient of thermal expansion the same as or close to the coefficient of the mounting substrate. An example of such resin can include, for example, epoxy resin, silicone resin, fluorine resin, or the like.

Furthermore, the resin layer 25 may be caused to contain carbon black to be provided with light-shielding properties for the light emitted from the light emitting layer 12a. In addition, the resin layer 25 may be caused to contain powder having a reflectivity for the light emitted from the light emitting layer 12a.

The first semiconductor layer 11 is electrically connected to the n-side metal pillar 24 including the n-side external terminal 24a via the n-side electrode 17 and the n-side interconnect layer 22. The second semiconductor layer 12 including the light emitting layer 12a is electrically connected to the p-side metal pillar 23 including the p-side external terminal 23a via the p-side electrode 16 and the p-side interconnect layer 21.

A part of the n-side interconnect layer 22 overlaps the insulating layer 18 on a light emitting region including the light emitting layer 12a. The area of the n-side interconnect layer 22 is larger than the n-side electrode 17. Furthermore, the area of the n-side interconnect layer 22 expanded on the insulating layer 18 is larger than the area connecting the n-side interconnect layer to the n-side electrode 17 through the second via 18b.

It is possible to obtain a high light output by the light emitting layer 12a formed over a region larger than the n-side electrode 17. And also, it is possible to realize a structure in which the n-side electrode 17 provided in a region, which is smaller than the light emitting region and does not include the light emitting layer 12a, is rearranged on the mounting face side as the n-side interconnect layer 22 having an area larger than the area of this region.

The area connecting the p-side interconnect layer 21 to the p-side electrode 16 through the plurality of first vias 18a is larger than the area connecting the n-side interconnect layer 22 to the n-side electrode 17 through the second via 18b. Accordingly, it is possible to improve current distribution to the light emitting layer 12a and also to improve radiation properties of heat generated in the light emitting layer 12a.

On the first face 15a of the semiconductor layer 15, a fluorescent body layer 31 is provided. The fluorescent body layer 31 contains phosphor particles capable of absorbing the emitted light (excited light) from the light emitting layer 12a and capable of emitting wavelength-converted light. The phosphor particles are dispersed in transparent resin which is transparent to the light from the light emitting layer 12a and the wavelength-converted light of the phosphor particles. The semiconductor light emitting device 10 can emit mixed light of the light from the light emitting layer 12a and the wavelength-converted light of the phosphor particles.

For example, when the phosphor particles are set to yellow phosphor particles emitting yellow light, it is possible to obtain white color or light bulb color as a mixed color between blue light from the light emitting layer 12a which is made of GaN-based fluorescent material and yellow light which is the wavelength-converted light in the fluorescent body layer 31.

For example, as shown in FIGS. 2A and 2B, the outer shape of the semiconductor light emitting device 10 in the plan view is formed in a rectangular shape, and three chips including one central chip 3a and two peripheral chips 3b are aligned in the longitudinal direction of the rectangle (one-dimensional direction).

The central chip 3a is positioned at the center of the three chips in the one-dimensional alignment direction. The two peripheral chips 3b are arranged symmetrically to each other sandwiching the central chip 3a in the one-dimensional alignment direction.

On the central chip 3a and the peripheral chips 3b, the same kind of fluorescent body layers 31 are provided. For example, the fluorescent body layers 31 containing the same kind of yellow phosphor particles are provided on the central chip 3a and the peripheral chips 3b.

The thicknesses of the fluorescent body layers 31 provided on the first faces 15a of the respective two peripheral chips 3b are the same.

The thickness of the fluorescent body layer 31 on the first face 15a in the central chip 3a is different from the thickness of the fluorescent body layers 31 on the first faces 15a in the peripheral chips 3b. In an example shown in FIG. 1, the fluorescent body layer 31 on the central chip 3a has a thickness smaller than the thickness of the fluorescent body layers 31 on the peripheral chips 3b.

As will be described below, the process of forming the fluorescent body layer 31 has a process of collectively supplying a liquid transparent resin in which phosphor particles are dispersed, on a plurality of chips in a wafer state and a process of performing thermal curing. Accordingly, the concentration (density) of the phosphor particles is approximately uniform within the wafer face.

Accordingly, a relatively thin fluorescent body layer 31 contains a smaller amount of the phosphor particles and a relatively thick fluorescent body layer 31 contains a larger amount of the phosphor particles. By adjusting the thickness of the fluorescent body layer 31, it is possible to adjust the chromaticity of the mixed light of the light emitted from the chips 3a and 3b and the wavelength-converted light in the fluorescent body layer 31.

Figure 15:
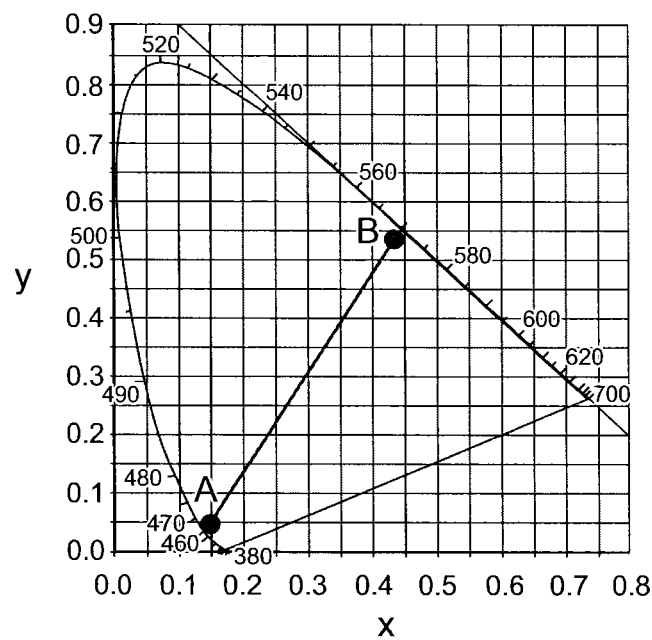
FIG. 15 is a CIExy chromaticity diagram showing adjustable range of chromaticity of a semiconductor light emitting device of a first embodiment.

FIG. 15 shows a CIExy chromaticity diagram. The coordinates A show the chromaticity of the blue light emitted from a GaN-based chip, and the coordinates B show the chromaticity of the light emitted from a yellow fluorescent body layer alone.

By adjusting the thickness of the fluorescent body layer 31, it is possible to adjust chromaticity along a straight line shown by the broken line between the coordinates A and the coordinate B. The chromaticity can be adjusted toward the coordinates A side when the fluorescent body layer 31 is relatively thin, and the chromaticity can be adjusted toward the coordinates B side when the fluorescent body layer 31 is relatively thick.

Figure 4:
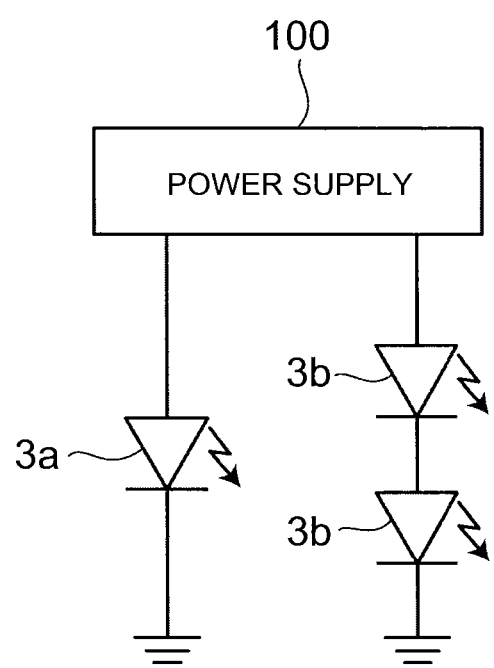
FIG. 4 is a circuit diagram showing a connection relationship between a plurality of chips in a semiconductor light emitting device of a first embodiment.

Furthermore, FIG. 4 is a circuit diagram showing a connection relationship between the central chip 3a and the peripheral chip 3b.

The central chip 3a and the peripheral chips 3b are connected in parallel to a power supply 100. The two peripheral chips 3b are connected in series.

By adjusting power supplied from the power supply 100 to each of the central chip 3a and the peripheral chips 3b which are connected in parallel, it is possible to adjust a ratio of light emission intensity between the central chip 3a and the peripheral chips 3b.

For example, by changing an input current amount relatively between the central chip 3a and the peripheral chips 3b, it is possible to adjust the ratio of the light emission intensity between the central chip 3a and the peripheral chips 3b. Alternatively, by adjusting a duty ratio of the input power between the central chip 3a and the peripheral chips 3b, it is possible to adjust the ratio of the light emission intensity between the central chip 3a and the peripheral chips 3b.

When the input power (current) is increased for the central chip 3a in which the fluorescent body layer 31 is relatively thin, the semiconductor light emitting device 10 emits mixed light having a larger amount of a blue component. When the input power (current) for the peripheral chips 3b in which the fluorescent body layers 31 are relatively thick, the semiconductor light emitting device 10 emits mixed light having a larger amount of a yellow component.

That is, by changing the thickness of the fluorescent body layer 31 provided on the first face 15a between the central chip 3a and the peripheral chips 3b and also by adjusting the input power between the central chip 3a and the peripheral chips 3b which are connected in parallel, it is possible to adjust the chromaticity of the mixed light emitted from the semiconductor light emitting device 10.

Moreover, according to the embodiment, while the thickness of the fluorescent body layer 31 is changed between the center and the periphery in the plan view from the light emitting face side, the fluorescent body layers 31 which have the same thickness and arranged symmetrically to each other with respect to the center are provided on the periphery. Accordingly, when the semiconductor light emitting device 10 is viewed from the fluorescent body layer 31 side in FIG. 1, a uniform color mixing effect and light distribution can be obtained.

Figure 3A:
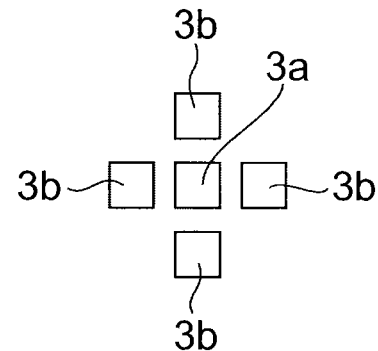
FIGS. 3A-3C show layouts of a plurality of chips in a semiconductor light emitting device of first embodiment.
Figure 3B:
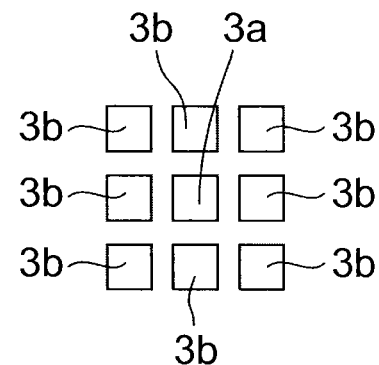
Figure 3C:
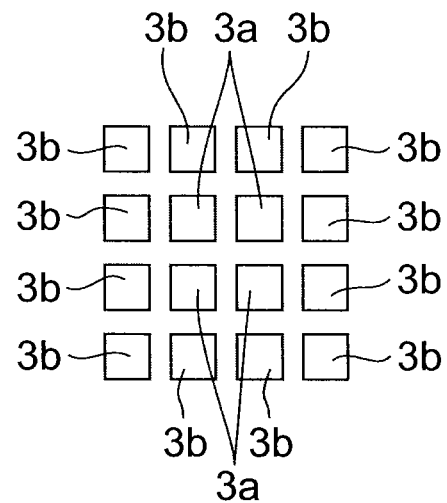

FIGS. 3A to 3C show other specific examples for the plan view layout of the central chip 3a and the peripheral chip 3b.

The plurality of chips including the central chip 3a and the peripheral chip 3b may be aligned in two-dimensional directions in a plane as shown in FIGS. 3A to 3C, not limited to the one dimensional direction. The number of the central chips 3a is not limited to one and may be not less than two. At least not less than two chips 3b are arranged symmetrically to each other sandwiching the central chip 3a, on the periphery of the central chip 3a.

FIG. 3A shows a layout in which four peripheral chips 3b are aligned in a cross shape on the periphery of one central chip 3a.

FIG. 3B show a layout in which eight peripheral chips 3b are aligned in a grid pattern on the periphery of one central chip 3a.

FIG. 3C shows a layout in which 12 peripheral chips 3b are aligned in a grid pattern on the periphery of four central chips 3a.

In any of the specific examples of FIGS. 3A to 3C, the thickness of the fluorescent body layer 31 provided on the first face 15a is changed between the central chip 3a and the peripheral chip 3b, and also the fluorescent body layers 31 having the same thickness are provided on the plurality of peripheral chips 3b. Accordingly, when the semiconductor light emitting device is viewed from the light emitting face side, a uniform color mixing effect and light distribution can be obtained.

Next, with reference to FIG. 5A to FIG. 7D, a manufacturing method of the semiconductor light emitting device 10 of the embodiment will be explained.

Figure 5A:
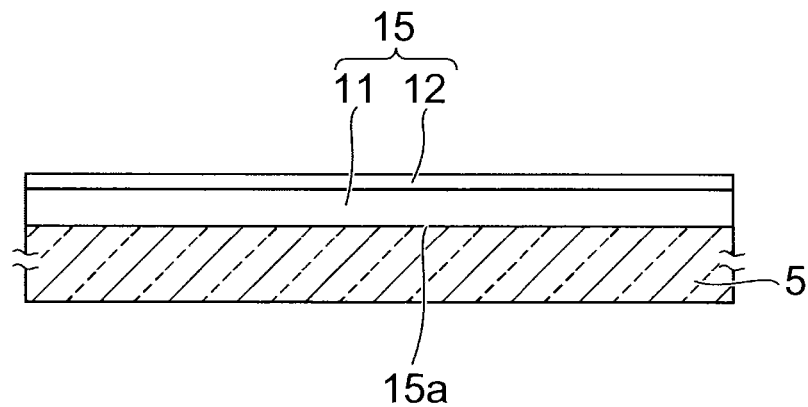
FIGS. 5A-7D show cross sections showing a manufacturing method of the semiconductor light emitting device of a first embodiment.

FIG. 5A shows a cross section of a wafer on which the semiconductor layer 15 including the first semiconductor layer 11 and the second semiconductor layer 12 is formed on a major face of the substrate 5. The first semiconductor layer 11 is formed on the major face of the substrate 5, and the second semiconductor layer 12 is formed on this first semiconductor layer 11.

For example, the first semiconductor layer 11 and the second semiconductor layer 12 which are made of gallium nitride-based material can be grown epitaxially on a sapphire substrate by an MOCVD (metal organic vapor deposition) method.

The first semiconductor layer 11 includes the foundation buffer layer and the n-type GaN layer. The second semiconductor layer 12 includes the light emitting layer 12a (shown in FIG. 1) and the p-type GaN layer. For the light emitting layer 12a, it is possible to use material emitting light of blue, violet, blue violet, near ultraviolet, ultraviolet, or the like. The face contacting the substrate 5 in the first semiconductor layer 11 is the first face 15a of the semiconductor layer 15.

Figure 5B:
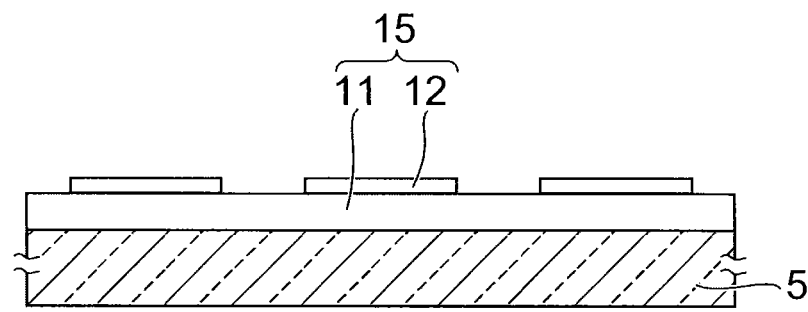

After the semiconductor layer 15 has been formed on the substrate 5, the second semiconductor layer 12 is selectively removed as shown in FIG. 5B by RIE (Reactive Ion Etching) using a resist which is not shown in the drawing, and the first semiconductor layer 11 is exposed selectively. The region where the first semiconductor layer 11 is exposed does not include the light emitting layer 12a.

Figure 5C:
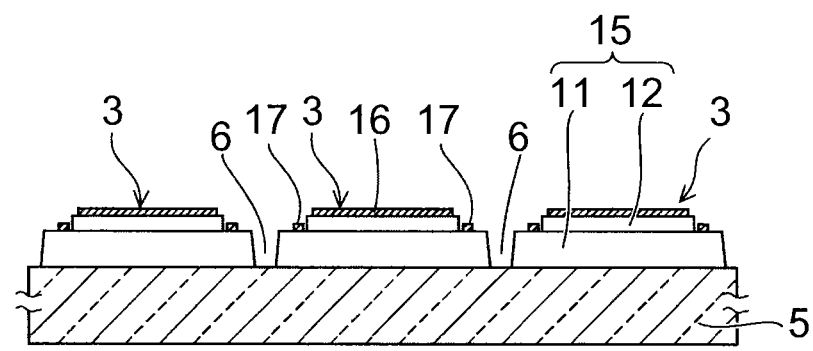

Next, as shown FIG. 5C, the p-side electrode 16 is formed on the face of the second semiconductor layer 12 and the n-side electrode 17 is formed on the face of the first semiconductor layer 11. The p-side electrode 16 and the n-side electrode 17 are formed by a sputter method, an evaporation method, or the like, for example. For the p-side electrode 16 and the n-side electrode 17, either one may be formed first and both ones may be formed with the same material at the same time.

Here, while illustration will be omitted from the process cross-sectional views after FIG. 5C, the insulating film 14 shown in FIG. 1 is formed on the second face side.

Next, a groove 6 reaching the substrate 5 is formed in the semiconductor layer 15 as shown in FIG. 5C by RIE, for example, using a resist mask which is not shown in the drawing. The grooves 6 are formed, for example, in a planar layout of a grid pattern, on the substrate 5 in a wafer state. The semiconductor layer 15 is divided into the plurality of chips 3 by the grooves 6.

The process dividing the semiconductor layer 15 into the plurality of chips 3 may be performed in the step shown in FIG. 5B before the electrodes 16 and 17 are formed.

Figure 6A:
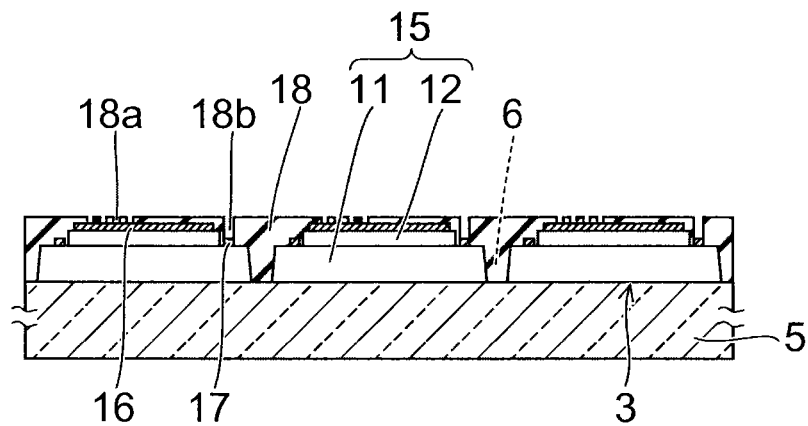

Next, the whole exposed part on the substrate 5 is covered by the insulating layer 18 shown in FIG. 6A. After that, the first via 18a and the second via 18b are formed in the insulating layer 18 by etching using a resist mask which is not shown in the drawing. The first via 18a reaches the p-side electrode 16 and the second via 18b reaches the n-side electrode 17.

Next, a metal film, which is not shown in the drawing, functioning as a seed metal for plating is formed on the interconnect face 18c which is the upper face of the insulating layer 18, the inner wall of the first via 18a, and the inner wall of the second via 18b. Then, resist which is not shown in the drawing is formed selectively on the metal film, and Cu electrolytic plating using the metal film as a current path is performed.

Figure 6B:
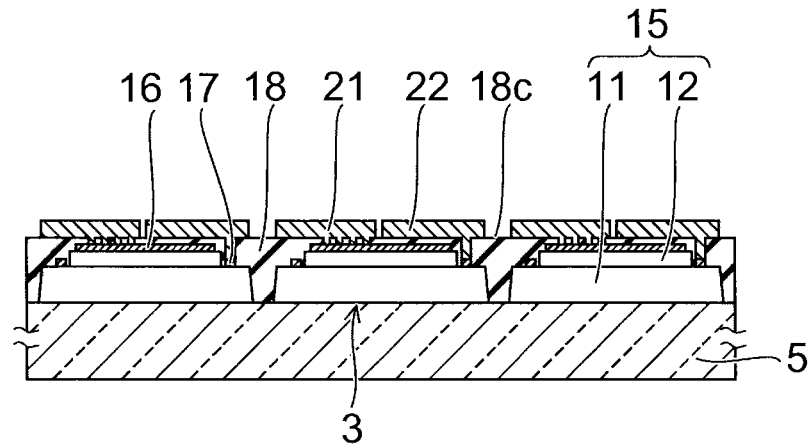

By this plating, on the interconnect face 18c, as shown in FIG. 6B, the p-side interconnect layer 21 and the n-side interconnect layer 22 are formed selectively. The p-side interconnect layer 21 and the n-side interconnect layer 22 are made of copper materials, for example, which are formed by plating at the same time.

The p-side interconnect layer 21 is also formed within the first via 18a and electrically connected to the p-side electrode 16 via the metal film of the seed metal. The n-side interconnect layer 22 is also formed within the second via 18b and electrically connected to the n-side electrode 17 via the metal film of the seed metal.

Figure 6C:
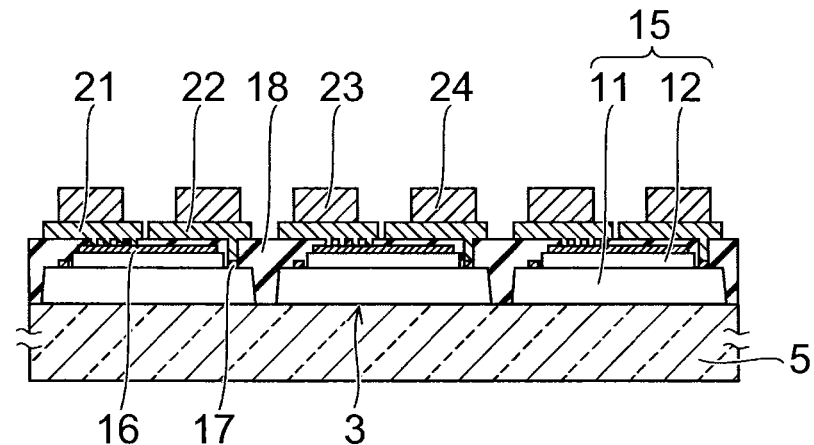

Next, Cu electrolytic plating is performed using resist which is not shown in the drawing as a mask and using the still remaining metal film as a current path. By this plating, as shown in FIG. 6C, the p-side metal pillar 23 and the n-side metal pillar 24 are formed. The p-side metal pillar 23 is formed on the p-side interconnect layer 21, and the n-side metal pillar 24 is formed on the n-side interconnect layer 22.

After the p-side metal pillar 23 and the n-side metal pillar 24 have been formed, the exposed part of the metal film which has been used as the seed metal is removed. Accordingly, the metal film connecting the p-side interconnect layer 21 and the n-side interconnect layer 22 is cut out.

Next, the resin layer 25 shown in FIG. 1 is formed. Then, in a state in which the chip 3 is supported by the support body including the p-side metal pillar 23, the n-side metal pillar 24, and the resin layer 25, the substrate 5 is removed by a laser lift-off method, for example.

A laser beam is directed toward the first semiconductor layer 11 from the rear face side of the substrate 5. The laser beam has a permeability to the substrate 5 and has a wavelength in the absorption region of the first semiconductor layer 11.

When the laser beam reaches the boundary face between the substrate 5 and the first semiconductor layer 11, the first semiconductor layer 11 near the boundary face absorbs the laser beam energy and is decomposed. For example, the first semiconductor layer 11 of the GaN-based material is decomposed into gallium (Ga) and nitrogen gas. By this decomposition reaction, a minute gap is formed between the substrate 5 and the first semiconductor layer 11, and the substrate 5 and the first semiconductor layer 11 are separated from each other. The laser irradiation is performed plural times for respective predetermined regions over the whole wafer and the substrate 5 is removed.

Since the semiconductor layer 15 is supported by the support body thicker than the semiconductor layer 15 and a wafer state can be kept even when the substrate 5 is removed. Furthermore, the resin constituting the resin layer 25 and the metal constituting the p-side metal pillar 23 and the n-side metal pillar 24 are soft material in comparison with the semiconductor layer 15 of the GaN-based material. Accordingly, even when a large internal stress generated in the epitaxial growth forming the semiconductor layer 15 on the substrate 5 is released in a single burst at the peeling of the substrate 5, it is possible to avoid the breakage of the chip 3.

Figure 7A:
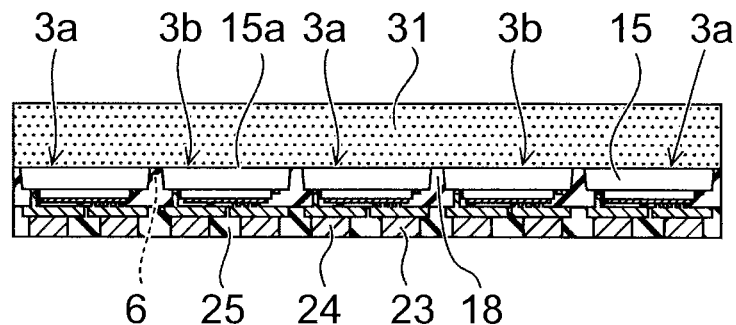

After the removal of the substrate 5, the first face 15a is cleaned and is subjected to frost processing forming unevenness as needed. By forming the minute unevenness on the first face 15a, it is possible to improve a light extraction efficiency. After that, as shown in FIG. 7A, on the first face 15a, the fluorescent body layer 31 is formed.

The process of forming the fluorescent body layer 31 includes a process of supplying liquid-state transparent resin in which the phosphor particles are dispersed onto the first face 15a by a method of printing, potting, molding, compression molding, or the like and a process of performing thermal curing of the transparent resin.

Figure 7B:
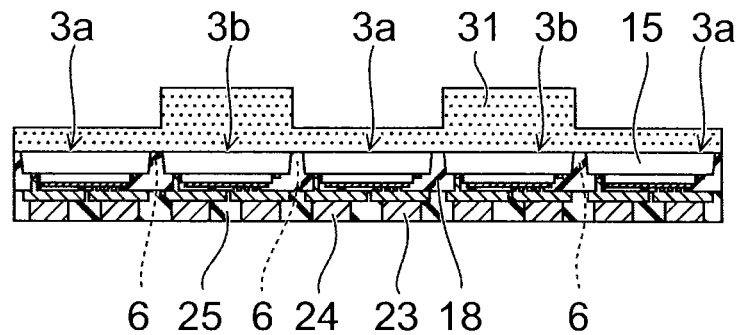

After the formation of the fluorescent body layer 31, the fluorescent body layer 31 is cut to be thinned selectively by mechanical cutting work, for example. Therefore, as shown in FIG. 7B, the variation in thickness of the fluorescent body layer 31 is given within the wafer.

The cut amount of the fluorescent body layer 31, that is, the thickness of the fluorescent body layer 31 is set based on the measurement result of the wavelength of the light obtained on the upper face side of the fluorescent body layer 31 when each of the chips 3a and 3b are caused to emit light in a wafer state.

Figure 7C:
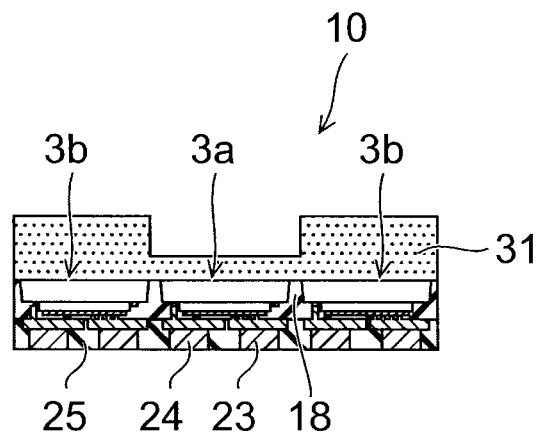

After that, the wafer is cut at the position of the groove 6 and divided into pieces of the plurality of the semiconductor light emitting devices 10. As shown in FIG. 7C, the semiconductor light emitting device 10 is divided from the wafer as a unit including one central chip 3a and two peripheral chips 3b arranged symmetrically to each other sandwiching the central chip 3a.

As described above, the thicknesses of the fluorescent body layers 31 provided on the two peripheral chips 3b are the same as each other and the fluorescent body layers 31 provided on the peripheral chips 3b is thicker than the fluorescent body layer 31 provided on the central chip 3a.

Figure 7D:
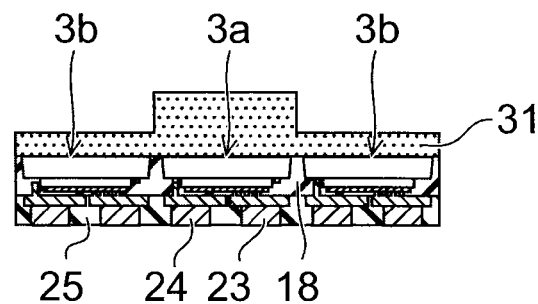

Alternatively, as shown in FIG. 7D, the fluorescent body layers 31 provided on the peripheral chips 3b may be thinner than the fluorescent body layer 31 provided on the central chip 3a. Also in this structure of FIG. 7D, a uniform color mixing effect and light distribution can be obtained when the semiconductor light emitting device is viewed from the light emitting face side.

In dicing, since the hard sapphire substrate 5 is already removed, it is not necessary to cut the substrate 5 and it becomes easy to perform the dicing.

Furthermore, in the groove 6, the semiconductor layer 15 is not formed but the insulating layer 18 of resin is provided. Moreover, in the lower part of the groove 6 in FIG. 7B, the resin layer 25 is provided. Accordingly, in the dicing region, the semiconductor layer 15 is not provided but the resin which is softer than the semiconductor layer 15 is provided. Therefore, it is possible to avoid a damage the semiconductor layer 15 receives during the dicing. In addition, in the dicing region, also the interconnect layer or the metal pillar is not provided.

Each of the processes before the dicing is collectively performed in a wafer state. Accordingly, after the dicing, it is not necessary to form the support body and protect chips by the insulating material, for each of the semiconductor light emitting devices 10, and thus it become possible to reduce production cost significantly. In a state of being divided into pieces, the side faces of the chips 3a and 3b is already covered and protected by the insulating layer 18.

Second Embodiment

Figure 8A:
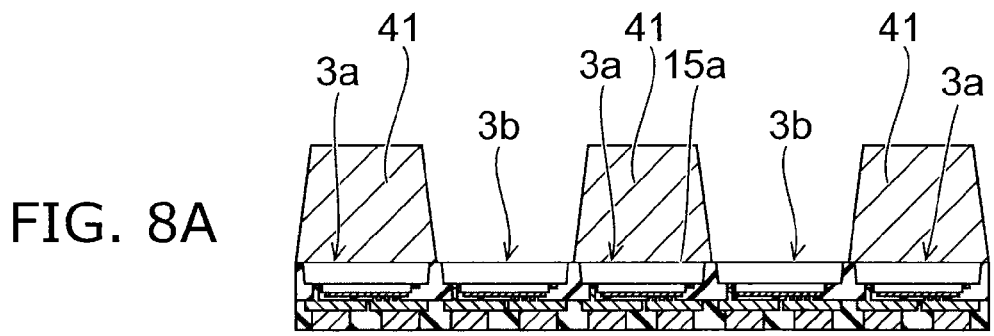
FIGS. 8A-8E show cross sections showing a manufacturing method of the semiconductor light emitting device of a second embodiment.
Figure 8B:
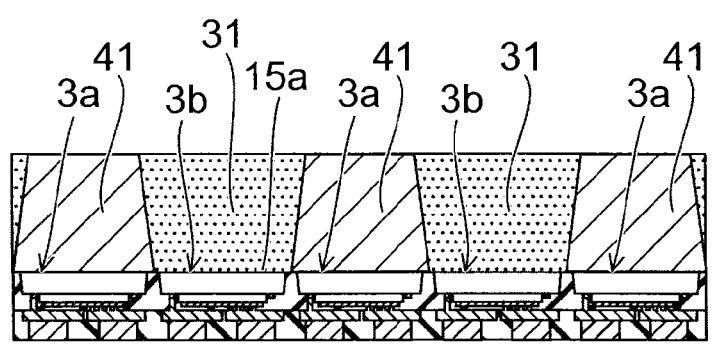
Figure 8C:
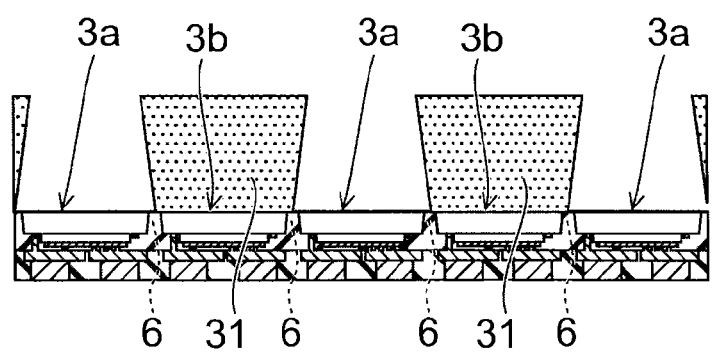
Figure 8D:
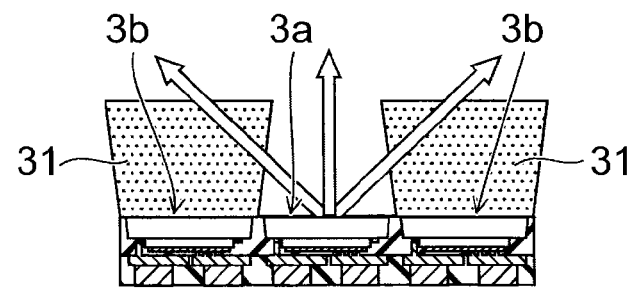

FIG. 8D is a schematic cross-sectional view of a semiconductor light emitting device of a second embodiment.

This semiconductor light emitting device, as the first embodiment, also includes, for example, one central chip 3a and two peripheral chips 3b arranged symmetrically to each other sandwiching the central chip 3a. The configurations of the chip and a support body supporting the chip are the same as the configurations in the first embodiment.

Furthermore, the central chip 3a and the peripheral chips 3b are connected in parallel to a power supply, and by adjusting power supplied from the power supply to each of the central chip 3a and the peripheral chips 3b, it is possible to adjust a ratio of light emission intensity between the central chip 3a and the peripheral chips 3b.

The thicknesses of the fluorescent body layers 31 provided on the two peripheral chips 3b are the same as each other. Moreover, the thickness of the fluorescent body layer 31 on the central chip 3a and the thickness of the fluorescent body layers 31 on the peripheral chips 3b are different from each other. In the second embodiment, the fluorescent body layer 31 is not provided on the central chip 3a and the thickness of the fluorescent body layer 31 on the central chip 3a is zero. That is, the expression in which the thickness of the fluorescent body layer 31 is different between the central chip 3a and the peripheral chips 3b includes the presence or absence of the fluorescent body layer 31.

Also in the second embodiment, by varying the thickness of the fluorescent body layer 31 between the central chip 3a and the peripheral chips 3b and also by adjusting input power between the central chip 3a and the peripheral chips 3b which are connected in parallel, it is possible to adjust the chromaticity of mixed light emitted from the semiconductor light emitting device.

Moreover, the fluorescent body layers 31 which are arranged symmetrically to each other with respect to the center and which have the same thickness are provided on the peripheral. Accordingly, it is possible to obtain a uniform color mixing effect and light distribution when the semiconductor light emitting device is viewed from the fluorescent body layer 31 side. 0

Furthermore, when the thickness of the fluorescent body layer 31 is varied between the central chip 3a and the peripheral chips 3b, the thickness of the fluorescent body layer 31 on the central chip 3a is set to zero, that is, the fluorescent body layer 31 is not provided on the central chip 3a. Accordingly, the usage of the fluorescent body layer 31 can be reduced and cost reduction is realized.

Here, from the central chip 3a, light is emitted also in a direction oblique to the first face 15a and the light can travel in the fluorescent body layers 31 on the peripheral chips 3b. Accordingly, the fluorescent body layer 31 on the peripheral chip 3b can perform wavelength conversion also by excitation of the light emitted from the central chip 3a.

Next, with reference to FIGS. 8A to 8D, a manufacturing method of the semiconductor light emitting device of the second embodiment will be explained.

The process up to the removal of the substrate 5 is carried out as in the first embodiment.

After a substrate 5 has been removed, as shown in 8A, a sacrifice layer 41 is formed on the chip 3a selected from among the chips within the wafer.

When the sacrifice layer 41 is a resin having photosensitivity, after the sacrifice layer 41 has been formed over the whole face of the wafer, the sacrifice layer 41 is exposed selectively through the use of a photo-mask. After the exposure, the sacrifice layer 41 is removed selectively by development.

Alternatively, after an inorganic sacrifice layer 41 has been formed over the whole face of the wafer, resist is formed on the sacrifice layer 41. Then, by exposure and development of the resist, the resist is patterned. Then, through the use of the patterned resist as a mask, the sacrifice layer 41 is etched selectively.

For example, the sacrifice layer 41 is formed on the plurality of chips within the wafer every other chip in the one-dimensional alignment direction.

After the formation of the sacrifice layer 41, the fluorescent body layer 31 is formed on the wafer. As shown in 8B, the fluorescent body layer 31 fills a space between the sacrifice layer 41 and the sacrifice layer 41 and is formed on the chip 3b on which the sacrifice layer 41 is not formed.

By forming the sacrifice layer 41 so as to cause the cross section thereof to have a trapezoidal shape, the upper end opening of a space between the sacrifice layer 41 and the sacrifice layer 41 becomes wider than the bottom part and embedding properties of the fluorescent body layer 31 are improved.

After that, the fluorescent body layer 31 on the sacrifice layer 41 is removed by cutting work, for example, and the upper face of the sacrifice layer 41 is exposed. Then, as shown in FIG. 8C, the sacrifice layer 41 is removed selectively. The fluorescent body layer 31 is left on the chip 3b.

Then, as in the first embodiment, the wafer is cut at the position of a groove 6 and divided into pieces of the semiconductor light emitting devices. As shown in FIG. 8D, the semiconductor light emitting device is divided from the wafer in a unit including one central chip 3a and two peripheral chips 3b arranged symmetrically to each other sandwiching the central chip 3a.

As described above, the thicknesses of the fluorescent body layers 31 provided on the two peripheral chips 3b are the same as each other and the fluorescent body layer 31 is not provided on the central chip 3a.

Figure 8E:
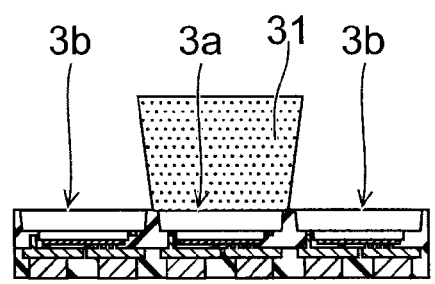

Alternatively, as shown in FIG. 8E, the semiconductor light emitting device may have a structure in which the fluorescent body layer 31 is provided on the central chip 3a and the fluorescent body layers 31 are not provided on the peripheral chips 3b. Also in this structure of FIG. 8E, since the thickness of the fluorescent body layer 31 on the periphery is varied (zero thickness) symmetrically with respect to the center, a uniform color mixing effect and light distribution can be obtained when the semiconductor light emitting device is viewed from the light emitting face side.

By the process using the sacrifice layer 41, it is possible easily to form the fluorescent body layer 31 selectively in a wafer level.

Third Embodiment

Figure 9A:
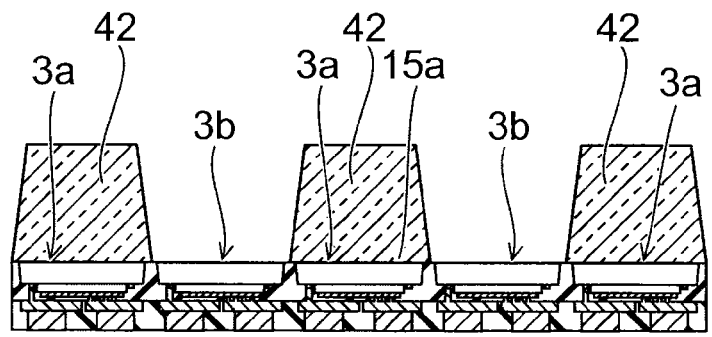
FIGS. 9A-9D show cross sections showing a manufacturing method of the semiconductor light emitting device of a third embodiment.
Figure 9B:
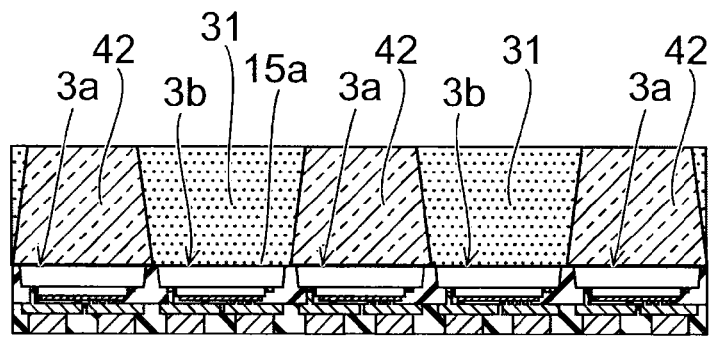
Figure 9C:
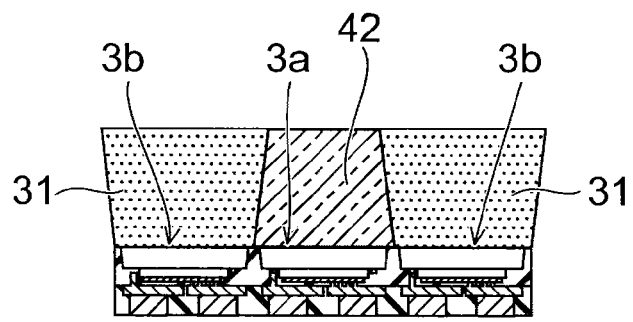

FIG. 9C is a schematic cross-sectional view of a semiconductor light emitting device of a third embodiment.

This semiconductor light emitting device, as the first embodiment, also includes one central chip 3a and two peripheral chips 3b arranged symmetrically to each other sandwiching the central chip 3a, for example. The configurations of the chip and a support body supporting the chip are the same as the configurations in the first embodiment.

Furthermore, the central chip 3a and the peripheral chips 3b are connected in parallel to a power supply, and, by adjusting power supplied from the power supply to each of the central chip 3a and the peripheral chips 3b, it is possible to adjust a ratio of light emission intensity between the central chip 3a and the peripheral chips 3b.

The thicknesses of the fluorescent body layers 31 provided on the two peripheral chips are the same as each other. Furthermore, the thickness of the fluorescent body layer 31 on the central chip 3a and the thickness of the fluorescent body layer 31 on the peripheral chips 3b are different from each other. In the third embodiment, the fluorescent body layer 31 is not provided on the central chip 3a and the thickness of the fluorescent body layer 31 on the central chip 3a is zero. Then, on the central chip 3a, a transparent resin layer 42 which is transparent to light emitted from the light emission layer is provided. By the transparent resin layer 42, the first face 15a of the central chip 3a can be protected.

Also in the third embodiment, by varying the thickness of the fluorescent body layer 31 between the central chip 3a and the peripheral chips 3b and also by adjusting input power for each of the central chip 3a and the peripheral chips 3b which are connected in parallel, it is possible to adjust the chromaticity of mixed light emitted from the semiconductor light emitting device.

Moreover, the fluorescent body layers 31 which are arranged symmetrically to each other with respect to the center and have the same thickness are provided on the peripheral. Accordingly, it is possible to obtain a uniform color mixing effect and light distribution when the semiconductor light emitting device is viewed from the fluorescent body layer 31 side.

Furthermore, when the thickness of the fluorescent body layer 31 is varied between the central chip 3a and the peripheral chip 3b, the thickness of the fluorescent body layer 31 on the central chip 3a is set to zero, that is, the fluorescent body layer 31 is not provided on the central chip 3a. Accordingly, the usage of the fluorescent body layer 31 can be reduced and cost reduction is realized.

Next, with reference to FIGS. 9A to 9C, a manufacturing method of the semiconductor light emitting device of the third embodiment will be explained.

The process up to the removal of the substrate 5 is carried out as in the first embodiment.

After the substrate 5 has been removed, as shown in 9A, the transparent resin layer 42 is formed on the chip 3a selected among the chips within the wafer.

When the transparent resin layer 42 is a resin having photosensitivity, after the transparent resin layer 42 has been formed over the whole face of the wafer, the transparent resin layer 42 is subjected to selective exposure by the use of a photo-mask. After the exposure, the transparent resin layer 42 is removed selectively by development.

Alternatively, after the transparent resin layer 42 has been formed over the whole face of the wafer, resist is formed on the transparent resin layer 42. Then, by exposure and development of the resist, the resist is patterned. After that, by the use of the patterned resist as a mask, the transparent resin layer 42 is etched selectively.

For example, the transparent resin layer 42 is formed on the plurality of chips within the wafer every other chip in the one-dimensional alignment direction.

After the formation of the transparent resin layer 42, the fluorescent body layer 31 is formed on the wafer. As shown in 9B, the fluorescent body layer 31 fills a space between the transparent resin layer 42 and the transparent resin layer 42 and is formed on the chip 3b on which the transparent resin layer 42 is not formed.

After that, as in the first embodiment, the wafer is cut at the position of a groove 6 and divided into pieces of the semiconductor light emitting devices. As shown in FIG. 9C, the semiconductor light emitting device is divided from the wafer in a unit including one central chip 3a and two peripheral chips 3b arranged symmetrically to each other sandwiching the central chip 3a.

As described above, the thicknesses of the fluorescent body layers 31 provided on the two peripheral chips 3b are the same as each other and on the central chip 3a, the fluorescent body layer 31 is not provided but the transparent resin layer 42 is provided.

Figure 9D:
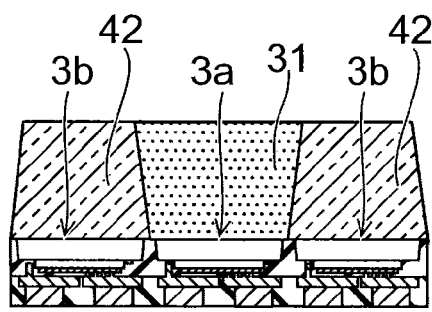

Alternatively, as shown in FIG. 9D, the semiconductor light emitting device may have a structure in which the fluorescent body layer 31 is provided on the central chip 3a and the transparent resin layers 42 are provided on the peripheral chips 3b instead of the fluorescent body layers 31. Also in this structure of FIG. 9D, since the thickness of the fluorescent body layer 31 on the periphery is varied (zero thickness) symmetrically with respect to the center, a uniform color mixing effect and light distribution can be obtained when the semiconductor light emitting device is viewed from the light emitting face side.

Fourth Embodiment

Figure 11A:
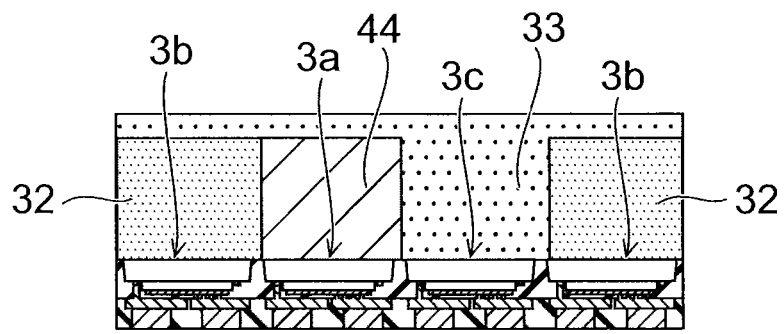
Figure 11B:
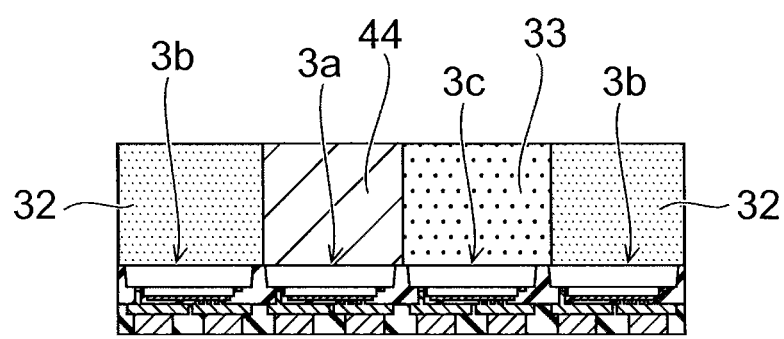
Figure 11C:
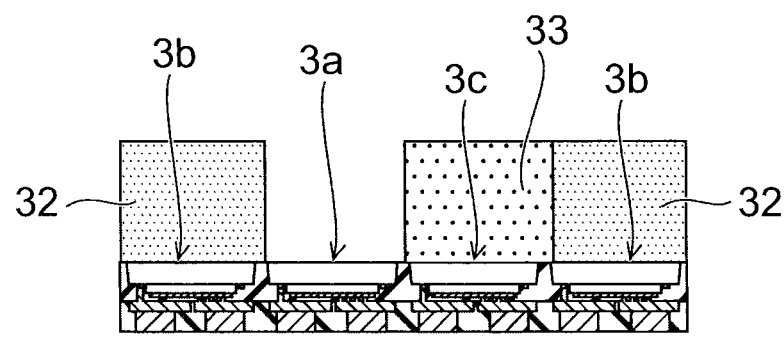
Figure 11D:
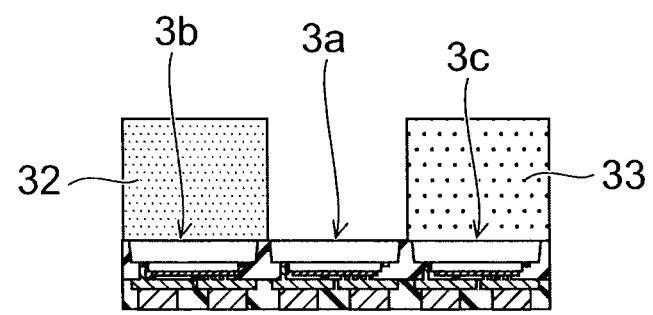

FIG. 11D is a schematic cross-sectional view of a semiconductor light emitting device of a fourth embodiment.

This semiconductor light emitting device also includes one central chip 3a and two peripheral chips 3b and 3c arranged symmetrically to each other sandwiching the central chip 3a, for example. The configurations of the chip and a support body supporting the chip are the same as the configurations in the first embodiment.

Of the two peripheral chips 3b and 3c, a first fluorescent body layer 32 is provided on one peripheral chip 3b and a second fluorescent body layer 33 is provided on the other chip 3c.

The kinds of the first fluorescent body layer 32 and the second fluorescent body layer 33 are different from each other. The first fluorescent body layer 32 has a structure in which green phosphor particles, emitting green light when receiving excitation light from the chip, are dispersed in transparent resin. The second fluorescent body layer 33 has a structure in which red phosphor particles, emitting red light when receiving excitation light form the chip, are dispersed in transparent resin.

The thickness of the first fluorescent body layer 32 provided on the peripheral chip 3b and the thickness of the second fluorescent body layer 33 provided on the peripheral chip 3c are the same as each other. A fluorescent body layer is not provided on the central chip 3a and the thickness of the fluorescent body layer on the central chip 3a is zero.

The central chip 3a, the peripheral chip 3b, and the peripheral chip 3c have the same configuration and emit blue light. Consequently, according to the semiconductor light emitting device of the fourth embodiment, the blue light from each of the chips, the green light from the first fluorescent body layer 32, and the red light from the second fluorescent body layer 33 are mixed, and white color or light bulb color are obtained.

Furthermore, the central chip 3a, the peripheral chip 3b, and the peripheral chip 3c are connected in parallel to a power supply, and, by adjusting power supplied from the power supply to each of the chips, it is possible to adjust ratios of emission intensity among the chips, and it is possible to adjust the chromaticity of the mixed light emitted from the semiconductor light emitting device.

Here, from the central chip 3a, light is emitted also in a direction oblique to the first face 15a and the light can travel in the first fluorescent body layer 32 on the peripheral chip 3b and in the second fluorescent body layer 33 on the peripheral chip 3c. Accordingly, the first fluorescent body layer 32 and the second fluorescent body layer 33 can perform wavelength conversion also by excitation of the light emitted from the central chip 3a.

Figure 16A:
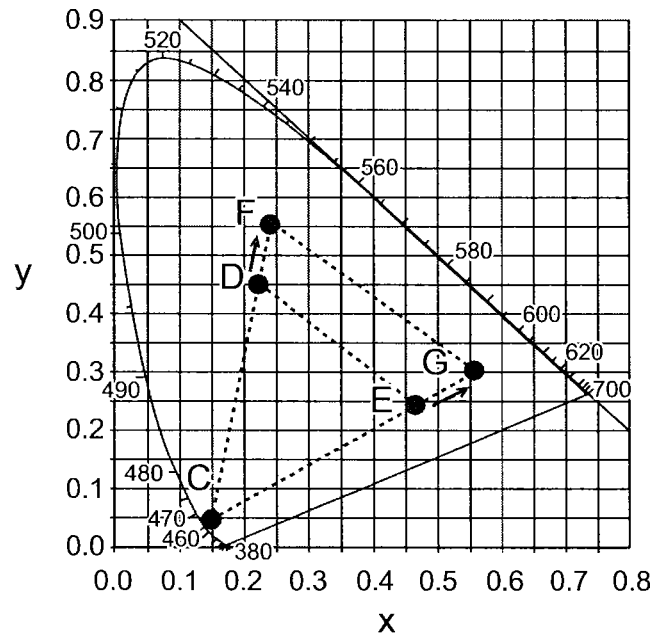
FIG. 16A is a CIExy chromaticity diagram showing adjustable range of chromaticity of semiconductor light emitting devices of a fourth and sixth embodiments.

FIG. 16A shows a CIExy chromaticity diagram. The coordinates C show the chromaticity of the blue light emitted from the central chip 3a on which a fluorescent body layer is not provided. The coordinates D show the chromaticity of mixed light of the emission light of the peripheral chip 3b and the emission light of the first fluorescent body layer 32 thereon. The coordinates E show the chromaticity of mixed light of the emission light of the peripheral chip 3c and the emission light of the second fluorescent body layer 33 thereon.

By adjusting input power for each of the central chip 3a, the peripheral chip 3b, and the peripheral chip 3c, it is possible to realize a chromaticity within a triangular range having the coordinates C, D, and E as apexes.

Next, with reference to FIGS. 10A to 11D, a manufacturing method of the semiconductor light emitting device of the fourth embodiment will be explained.

The process up to the removal of the substrate 5 is carried out as in the first embodiment.

After a substrate 5 has been removed, as shown in 10A, a first sacrifice layer 43 is formed on the chip selected among the chips within the wafer. In a partial cross section of the wafer shown in FIG. 10A, the first sacrifice layer 43 is formed on the two chips 3a and 3c neighboring each other.

When the first sacrifice layer 43 is a resin having photosensitivity, after the first sacrifice layer 43 has been formed over the whole face of the wafer, the first sacrifice layer 43 is subjected to selective exposure through the use of a photomask. After the exposure, the first sacrifice layer 43 is removed selectively by development.

Alternatively, after an inorganic first sacrifice layer 43 has been formed over the whole face of the wafer, resist is formed on the first sacrifice layer 43. Then, by exposure and development of the resist, the resist is patterned. After that, through the use of the patterned resist as a mask, the first sacrifice layer 43 is etched selectively.

Figure 10A:
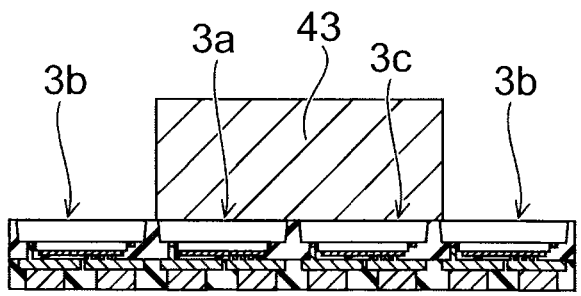
FIGS. 10A-11D show cross sections showing a manufacturing method of the semiconductor light emitting device of a fourth embodiment.
Figure 10B:
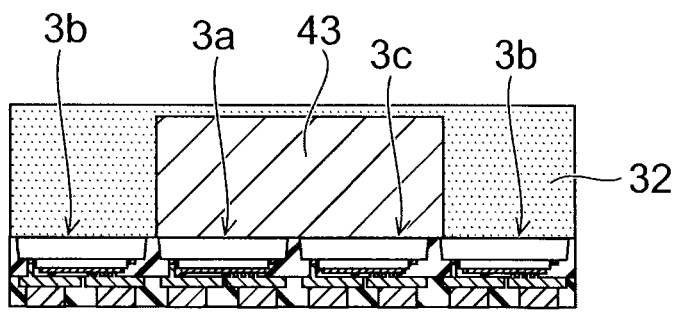

After the formation of the first sacrifice layer 43, as shown in FIG. 10B, the first fluorescent body layer 32 is formed on the wafer. The first fluorescent body layer 32 is formed on the chip 3b on which the first sacrifice layer 43 is not formed.

Figure 10C:
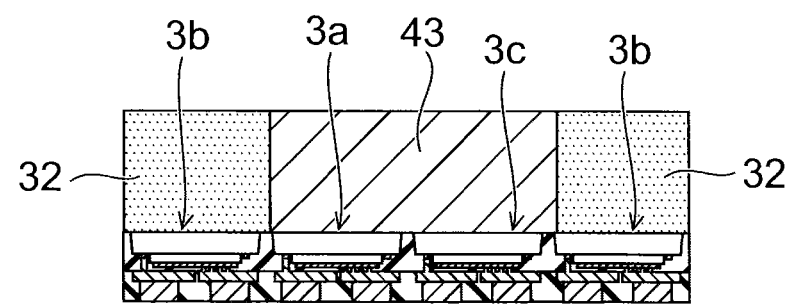
Figure 10D:
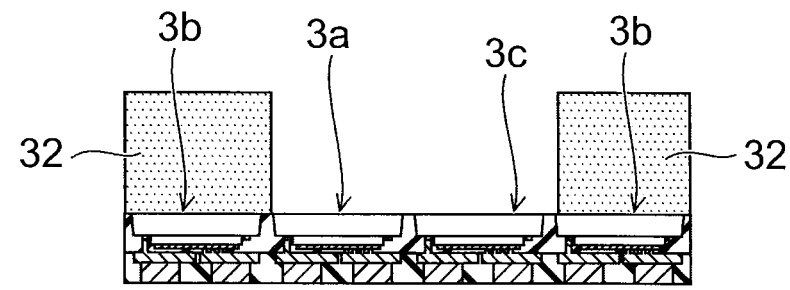

After that, the first fluorescent body layer 32 on the first sacrifice layer 43 is removed by cutting work, for example, and, as shown in FIG. 10C, the upper face of the first sacrifice layer 43 is exposed. Then, as shown in FIG. 10D, the first sacrifice layer 43 is removed selectively. The first fluorescent body layer 32 is left on the chip 3b.

Figure 10E:
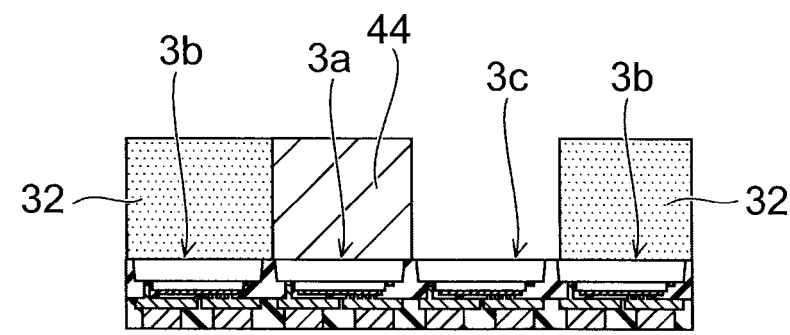

Next, on one chip 3a of two neighboring chips 3a and 3c on which the first sacrifice layers 43 are removed, as shown in FIG. 10E, a second sacrifice layer 44 is formed. The second sacrifice layer 44 can be formed by the same method as the first sacrifice layer 43.

After the formation of the second sacrifice layer 44, as shown in FIG. 11A, the second fluorescent body layer 33 is formed on the wafer. The second fluorescent body layer 33 is formed on the chip 3c on which the first fluorescent body layer 32 is not formed or the second sacrifice layer 44 is not formed.

After that, the second fluorescent body layers 33 on the first fluorescent body layer 32 and the second sacrifice layer 44 are removed by cutting work, for example, and as shown in FIG. 11B, the upper face of the first fluorescent body layer 32 and the upper face of the second sacrifice layer 44 are exposed.

Then, as shown in FIG. 11C, the second sacrifice layer 44 is removed selectively. The first fluorescent body layer 32 is left on the chip 3b, and the second fluorescent body layer 33 is left on the chip 3c.

After that, as in the first embodiment, the wafer is cut at the position of a groove 6 and divided into pieces of the semiconductor light emitting devices. As shown in FIG. 11D, the semiconductor light emitting device is divided from the wafer in a unit including one central chip 3a and two peripheral chips 3b and 3c aligned symmetrically to each other sandwiching the central chip 3a.

By the process using the first sacrifice layer 43 and the second sacrifice layer 44, it is possible easily to form the structure including, in one package, the central chip 3a on which a fluorescent body layer is not provided, the peripheral chip 3b on which the first fluorescent body layer 32 is provided, and the peripheral chip 3c on which the second fluorescent body layer 33 of a kind different from the first fluorescent body layer 32 is provided, in a wafer level.

Fifth Embodiment

Figure 12A:
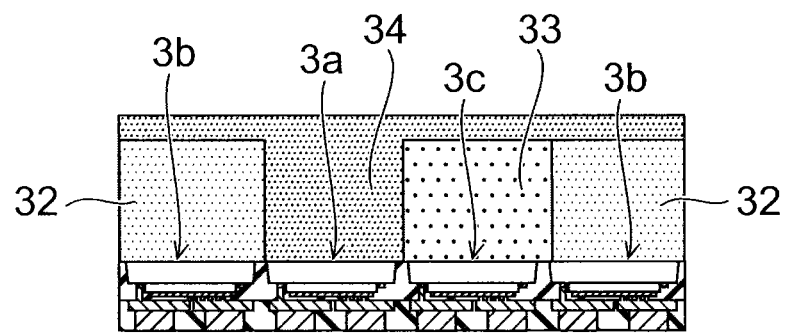
FIGS. 12A-12C show cross sections showing a manufacturing method of the semiconductor light emitting device of a fifth embodiment.
Figure 12B:
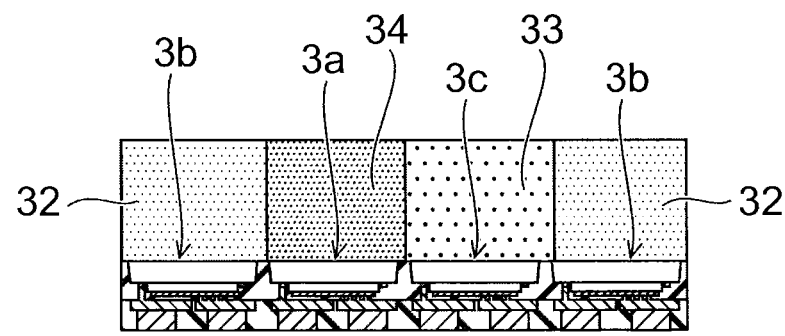
Figure 12C:
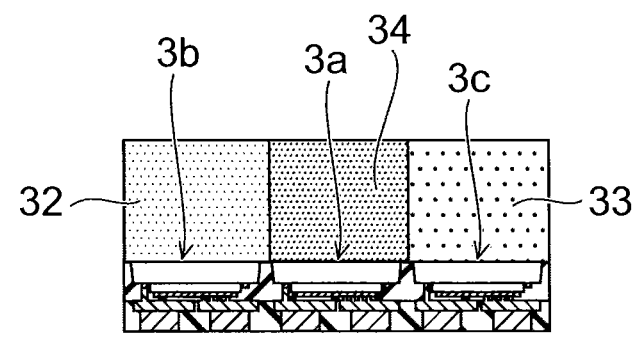

FIG. 12C is a schematic cross-sectional view of a semiconductor light emitting device of a fifth embodiment.

This semiconductor light emitting device also includes one central chip 3a and two peripheral chips 3b and 3c arranged symmetrically to each other sandwiching the central chip 3a, for example. The configurations of the chip and a support body supporting the chip are the same as the configurations in the first embodiment.

Of the two peripheral chips 3b and 3c, the first fluorescent body layer 32 is provided on one peripheral chip 3b and the second fluorescent body layer 33 is provided on the other chip 3c. On the central chip 3a, a third fluorescent body layer 34 is provided.

The kinds of the first fluorescent body layer 32, the second fluorescent body layer 33, and the third fluorescent body layer 34 are different from one another. The first fluorescent body layer 32 has a structure in which green phosphor particles emitting green light when receiving excitation light from the chip, are dispersed in transparent resin. The second fluorescent body layer 33 has a structure in which red phosphor particles emitting red light when receiving excitation light form the chip, are dispersed in transparent resin. The third fluorescent body layer 34 has a structure in which blue phosphor particles emitting blue light when receiving excitation light from the chip, are dispersed in transparent resin.

The central chip 3a, the peripheral chip 3b, and the peripheral chip 3c have the same configuration and emit ultraviolet light or near-ultraviolet light. The ultraviolet light or near-ultraviolet light emitted from the chips 3a and 3b is not a component directly constituting white light.

That is, according to the semiconductor light emitting device of the fifth embodiment, the green light from the first fluorescent body layer 32, the red light from the second fluorescent body layer 33 and the blue light from the third fluorescent body layer 34 are mixed, and white color or light bulb color is obtained.

Furthermore, the central chip 3a, the peripheral chip 3b, and the peripheral chip 3c are connected in parallel to a power supply, and, by adjusting power supplied from the power supply to each of the chips, it is possible to adjust ratios of light emission intensity among the chips, and it is possible to adjust the chromaticity of the mixed light emitted from the semiconductor light emitting device.

Figure 16B:
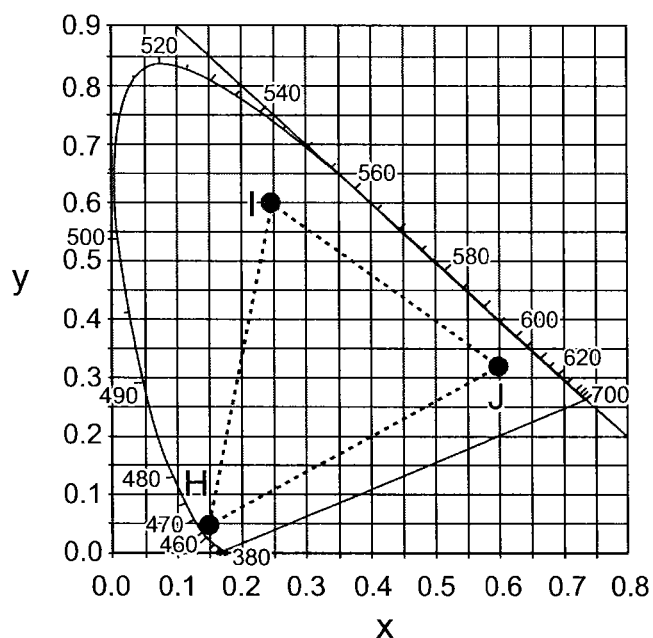
FIG. 16B is a CIExy chromaticity diagram showing adjustable range of chromaticity of a semiconductor light emitting device of a fifth embodiment.

FIG. 16B shows a CIExy chromaticity diagram. The coordinates H show the chromaticity of the emission light (blue light) of the third single fluorescent body layer 34. The coordinates I show the chromaticity of the emission light (green light) of the first single fluorescent body layer 32. The coordinates J show the chromaticity of the emission light (red light) of the second single fluorescent body layer 33.

By adjusting input power for the central chip 3a, the peripheral chip 3b, and the peripheral chip 3c, it is possible to realize a chromaticity within a triangular range having the coordinates H, I, and J as apexes.

Next, with reference to FIGS. 12A to 12C, a manufacturing method of the semiconductor light emitting device of the fifth embodiment will be explained.

The process up to the removal of the second sacrifice layer 44 shown in FIG. 11C is carried out as in the fourth embodiment.

After the second sacrifice layer 44 has been removed, as shown in FIG. 12A, the third fluorescent body layer 34 is formed on the wafer. The third fluorescent body layer 34 is formed on the chip 3a on which the second sacrifice layer 44 is removed.

After that, the third fluorescent body layers 34 on the first fluorescent body layer 32 and the second fluorescent body layer 33 are removed by cutting work, for example, and as shown in FIG. 12B, the upper face of the first fluorescent body layer 32 and the upper face of the second fluorescent body layer 33 are exposed.

Then, the wafer is cut at the position of a groove 6 and divided into pieces of the semiconductor light emitting devices. As shown in FIG. 12C, the semiconductor light emitting device is divided from the wafer in a unit including one central chip 3a and two peripheral chips 3b and 3c arranged symmetrically to each other sandwiching the central chip 3a.

According to the fifth embodiment, by the process using the first sacrifice layer 43 and the second sacrifice layer 44, it is possible easily to form the structure including, in one package, the peripheral chip 3b on which the first fluorescent body layer 32 is provided, the peripheral chip 3c on which the second fluorescent body layer 33 of a kind different from the first fluorescent body layer 32 is provided, and the central chip 3a on which the third fluorescent body layer 34 of a kind different from the first fluorescent body layer 32 and the second fluorescent body layer 33 is provided, in a wafer level.

Sixth Embodiment

Figure 13A:
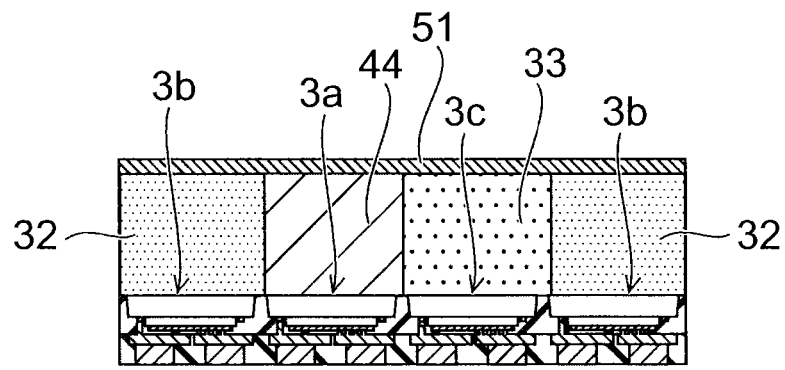
FIGS. 13A-13C show cross sections showing a manufacturing method of the semiconductor light emitting device of a sixth embodiment.
Figure 13B:
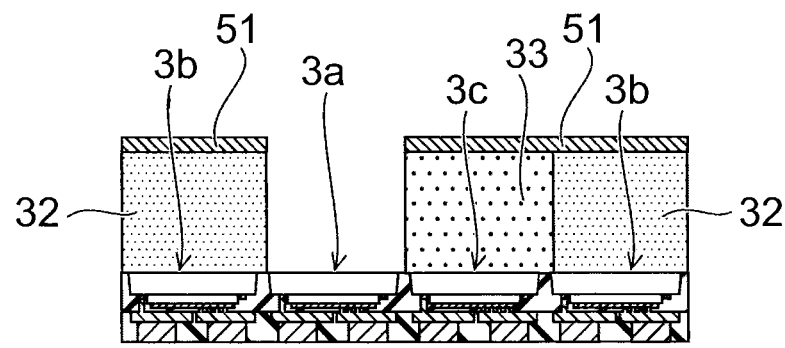
Figure 13C:
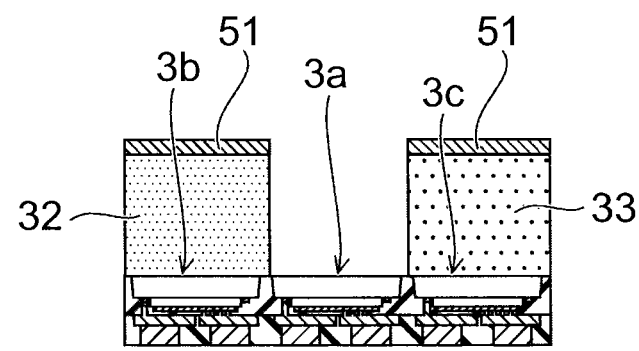

FIG. 13C is a schematic cross-sectional view of a semiconductor light emitting device of a sixth embodiment.

This semiconductor light emitting device is different from the semiconductor light emitting device of the fourth embodiment which is shown in FIG. 11D in the point that optical filter films 51 are formed on the upper face of the first fluorescent body layer 32 and the upper face of the second fluorescent body layers 33.

The optical filter film 51 is a dielectric multilayer film, for example, and has a reflectivity for the blue light emitted from the chips 3a and 3b. The optical filter film 51 has a permeability to the green light emitted from the first fluorescent body layer 32 and the red light emitted from the second fluorescent body layer 33a.

FIG. 16A shows a CIExy chromaticity diagram. The coordinates C show the chromaticity of the blue light emitted from the central chip 3a on which a fluorescent body layer is not provided. The coordinates F show the chromaticity of the emission light (green light) from the first fluorescent body layer (green fluorescent body layer) 32 on the upper face of which the optical filter film 51 is provided. The coordinates G show the chromaticity of the emission light (red light) from the second fluorescent body layer (red fluorescent body layer) 33 on the upper face of which the optical filter film 51 is provided.

According to the sixth embodiment, by adjusting input power for the central chip 3a, the peripheral chip 3b, and the peripheral chip 3c, it is possible to realize a chromaticity within a triangular range having the coordinates C, F, and G as apexes.

In the sixth embodiment, on the upper face of the green fluorescent body layer and the upper face of the red fluorescent body layer, the optical filter film 51 is provided reflecting the blue light from the chip. Accordingly, it is possible to expand the chromaticity adjustable range in the sixth embodiment more than in the fourth embodiment which can realize a chromaticity within the rectangular range having the coordinates C, D, and E as apexes.

Next, with reference to FIGS. 13A to 13C, a manufacturing method of the semiconductor light emitting device of the sixth embodiment will be explained.

The process up to the formation of the second fluorescent body layer 33 shown in FIG. 11B is carried out as in the fourth embodiment.

Then, after the second fluorescent body layer 33 has been formed, as shown in FIG. 13A, the optical filter film 51 is formed on the upper face of the first fluorescent body layer 32, the upper face of the second sacrifice layer 44, and the upper face of the second fluorescent body layer 33 over the whole face of the wafer.

Next, as shown in FIG. 13B, the second sacrifice layer 44 is removed selectively. The optical filter film 51 on the upper face of the second sacrifice layer 44 is removed by lift-off together with the second sacrifice layer 44.

After that, the wafer is cut at the position of a groove 6 and divided into pieces of the semiconductor light emitting devices. As shown in FIG. 13C, the semiconductor light emitting device is divided from the wafer in a unit including one central chip 3a and two peripheral chips 3b and 3c arranged symmetrically to each other sandwiching the central chip 3a.

By the process using the first sacrifice layer 43 and the second sacrifice layer 44, it is possible easily to form the structure including, in one package, the central chip 3a on which a fluorescent body layer is not provided, the peripheral chip 3b on which the optical filter film 51 and the first fluorescent body layer 32 are provided, and the peripheral chip 3c on which the optical filter film 51 and the second fluorescent body layer 33 are provided, in a wafer level.

Seventh Embodiment

Figure 14A:
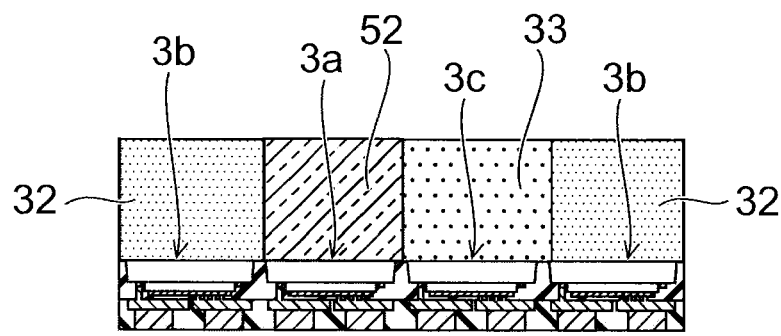
FIGS. 14A and 14B show cross sections showing a manufacturing method of the semiconductor light emitting device of a seventh embodiment.
Figure 14B:
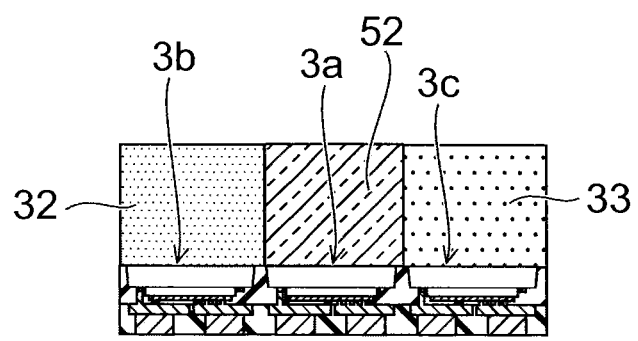

FIG. 14B is a schematic cross-sectional view of a semiconductor light emitting device of a seventh embodiment.

This semiconductor light emitting device is different from the semiconductor light emitting device of the fourth embodiment which is shown in FIG. 11D in that a transparent resin layer 52 is provided on the central chip 3a. The transparent resin layer 52 is transparent to the light emitted from the chips 3a and 3b. By the transparent resin layer 52, the first face 15a of the central chip 3a can be protected.

Next, with reference to FIGS. 14A to 14B, a manufacturing method of the semiconductor light emitting device of the seventh embodiment will be explained.

The process up to the removal of second sacrifice layer 44 shown in FIG. 11C is carried out as in the fourth embodiment.

Then, on the chip 3a on which the second sacrifice layer 44 is removed, as shown in FIG. 14A, the transparent resin layer 52 is formed.

Then, the wafer is cut at the position of a groove 6 and divided into pieces of the semiconductor light emitting devices. As shown in FIG. 14B, the semiconductor light emitting device is divided from the wafer in a unit including one central chip 3a and two peripheral chips 3b and 3c arranged symmetrically to each other sandwiching the central chip 3a.

According to the seventh embodiment, by the process using the first sacrifice layer 43 and the second sacrifice layer 44, it is possible to easily form the structure at a wafer level, including, in one package, the peripheral chip 3b on which the first fluorescent body layer 32 is provided, the peripheral chip 3c on which the second fluorescent body layer 33 of a kind different from the first fluorescent body layer 32, and the central chip 3a on which the transparent resin layer 52 is provided.

In each of the above described embodiments, after removing the substrate to expose the first face 15 and before forming the fluorescent body layer, by forming an inorganic film such as a silicon nitride film over the whole face, the protection of the first face 15 and the improvement of the light extraction efficiency can be realized.

As the above described fluorescent body layer, a red fluorescent body layer, yellow fluorescent body layer, a green fluorescent body layer, or a blue fluorescent body layer to be illustrated below, can be used.

The red fluorescent body layer can contain, for example, a nitride-based fluorescent body $CaAlSiN_3$:Eu or a SiAlON-based fluorescent body.

When the SiAlON-based fluorescent body is used, in particular $$(M_{1-x}R_x)_{a1}AlSi_{b1}O_{c1}N_{d1} \quad \text{composition formula (1)}$$

(Here, M is at least one kind of metal element excluding Si and Al, and in particular, at least either one of Ca and Sr is desirable. R is a light emission center element and in particular, Eu is desirable. x, a1, b1, c1, and d1 satisfy the following relationship. x is larger than 0 and 1 or less, a1 is larger than 0.6 and less than 0.95, b1 is larger than 2 and less than 3.9, c1 is larger than 0.25 and less than 0.45, and d1 is larger than 4 and less than 5.7) can be used.

By using the SiAlON-based fluorescent body expressed by composition formula (1), it is possible to improve the temperature characteristics of the wavelength conversion efficiency and further improve the efficiency in a large current density region.

The yellow fluorescent body layer can contain, for example, a silicate-based fluorescent body $(Sr, Ca, Ba)_2SiO_4$: Eu.

The green fluorescent body layer can contain, for example, a halophosphoric acid-based fluorescent body $(Ba, Ca, Mg)_{10}(PO_4)_6Cl_2$:Eu or a SiAlON-based fluorescent body.

When the SiAlON-based fluorescent body is used, in particular,

$(M_{1-x}R_x)_{a2}AlSi_{b2}O_{c2}N_{d2}$     composition formula (2)

(Here, M is at least one kind of metal element excluding Si and Al, and in particular, at least either one of Ca and Sr is desirable. R is a light emission center element and in particular, Eu is desirable. x, a2, b2, c2, and d2 satisfy the following relationship. x is larger than 0 and 1 or less, a2 is larger than 0.93 and less than 1.3, b2 is larger than 4.0 and less than 5.8, c2 is larger than 0.6 and less than 1, and d2 is larger than 6 and less than 11) can be used.

By using the SiAlON-based fluorescent body represented by composition formula (2), it is possible to improve the temperature characteristics of the wavelength conversion efficiency and further improve the efficiency in a large current density region.

The blue fluorescent body layer can contain, for example, an oxide-based fluorescent body $BaMgAl_{10}O_{17}$:Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   not less than three chips, each of the chips including a semiconductor layer having a first face, a second face formed on a side opposite to the first face, and a light emitting layer, a p-side electrode provided on the second face in a region having the light emitting layer, and an n-side electrode provided on the second face in a region without having the light emitting layer;
   a resin layer provided on the first faces of the chips;
   a first insulating layer provided on the second face side and having a first via leading to the p-side electrode, a second via leading to the n-side electrode, and a interconnect face formed on a side opposite to the first face; and
   a second insulating layer provided on the interconnect face side of the first insulating layer,
   each of the chips including an interconnect part including:
      p-side interconnect part provided on the interconnect face on the first insulating layer and being electrically connected to the p-side electrode through the first via; and
      a n-side interconnect part provided on the interconnect face and being electrically connected to the n-side electrode through the second via;
   the second insulating layer integrally provided between the p-side interconnect part and the n-side interconnect part of each of the chips around the interconnect part of each of the chips, and between adjacent the interconnect part of the chips; and
   the resin layer including:
      a first resin layer including a first phosphor particle and provided on the first face side of one of the chips; and
      a second resin layer including a second phosphor particle being different from the first phosphor particle, the second resin layer provided on the first face side of another of the chips.

2. The device according to claim 1, wherein the first insulating layer covers a side face continuing from the first face of the chip.

3. The device according to claim 1, wherein
   the p-side interconnect part has
      a p-side interconnect layer provided within the first via and on the interconnect face and
      a p-side metal pillar which is provided on the p-side interconnect layer and has a thickness larger than the thickness of the p-side interconnect layer, and
   the n-side interconnect part has
      an n-side interconnect layer provided within the second via and on the interconnect face and
      n-side metal pillar which is provided on the n-side interconnect layer and has a thickness larger than the thickness of then-side interconnect layer.

4. The device according to claim 1, wherein a cross-section shape of the resin layer is an inverted trapezoid.

5. The device according to claim 1, wherein the n-side interconnect part overlaps the first insulating layer on the region having the light emitting layer.

6. The device according to claim 1, wherein
   an upper surface of the first resin layer is coplanar with an upper surface of the second resin layer, and
   a side surface of the resin layer is coplanar with a side surface of the second insulating layer.

7. The device according to claim 1, wherein the first face of the semiconductor layer has a minute unevenness.

8. The device according to claim 1, wherein
   the chips includes a first chip and a second chip arranged adjacently to each other,
   a side surface of the first resin layer provided on the first chip has an acute angle with respect to the first face, and
   a side surface of the second resin layer provided on the second chip as an obtuse angle with respect to the first face.

9. The device according to claim 1, wherein
   the resin layer is provided on the first face side without a substrate between the resin layer and the chips,
   the p-side interconnect part includes a p-side extraction electrode,
   the n-side interconnect part includes an n-side extraction electrode, and
   the p-side extraction electrode and the n-side extraction electrode are not bonded to a mounting member.

* * * * *